US007267597B2

(12) United States Patent
Konishi et al.

(10) Patent No.: US 7,267,597 B2
(45) Date of Patent: Sep. 11, 2007

(54) METHOD OF PRODUCING AN INFRARED LAMP

(75) Inventors: Masanori Konishi, Takamatsu (JP); Kenji Higashiyama, Niihama (JP); Hirofumi Tange, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/046,585

(22) Filed: Jan. 28, 2005

(65) Prior Publication Data

US 2005/0136785 A1 Jun. 23, 2005

Related U.S. Application Data

(62) Division of application No. 09/997,084, filed on Nov. 28, 2001, now Pat. No. 6,922,017.

(30) Foreign Application Priority Data

Nov. 30, 2000 (JP) ............................ 2000-365952
Dec. 18, 2000 (JP) ............................ 2000-383364

(51) Int. Cl.
*H01L 9/24* (2006.01)
(52) U.S. Cl. .......................................... 445/27; 445/26
(58) Field of Classification Search .................. 445/26, 445/43, 66; 392/421
See application file for complete search history.

(56) References Cited

U.S. PATENT DOCUMENTS 4,125,761 A 11/1978 Churchill .................... 219/544
6,354,901 B1 * 3/2002 Bundo et al. ................. 445/26
6,407,371 B1 6/2002 Toya et al. ................. 219/553
6,515,264 B2 2/2003 Yamamura et al. ......... 219/553
6,627,144 B1 9/2003 Suda et al. ................. 264/670

FOREIGN PATENT DOCUMENTS

| | | |
|---|---|---|
| JP | 05-182747 | 7/1993 |
| JP | 11054092 | 2/1999 |
| JP | 11-211105 | 8/1999 |
| JP | 11-214125 | 8/1999 |
| JP | 2000-48938 | 2/2000 |
| JP | 2000-150115 | 5/2000 |
| JP | 2000-228271 | 8/2000 |
| JP | 2000-306657 | 11/2000 |
| JP | 2000-15250 | 1/2001 |
| JP | 2001-155692 | 8/2001 |
| WO | WO 99/22551 | 5/1999 |

* cited by examiner

*Primary Examiner*—Joseph Williams
(74) *Attorney, Agent, or Firm*—Sheridan Ross P.C.

(57) ABSTRACT

A material including a carbon-based substance and resins are mixed, and the mixture is extruded and dried, and the extrusion is sintered in an inert atmosphere, thereby obtaining a heating element material. The heating element material is reheated in a vacuum so that its resistance-temperature characteristic is adjusted to a necessary value, thereby obtaining a heating element for an infrared lamp. The heating element is a wire-shaped or plate-shaped heating element including the carbon-based substance, and an internal lead wire is wound around each of both ends of the heating element directly or via a graphite block so that a tight fit can be obtained. A coil spring is formed in the middle of the internal lead wire. The heating element is accommodated in a quartz glass tube filled with an inert gas.

7 Claims, 14 Drawing Sheets

METHOD OF PRODUCING AN INFRARED LAMP

This application is a divisional of U.S. patent application Ser. No. 09/997,084, filed Nov. 28, 2001, which claims priority to Japanese Patents 2000-365952, filed Nov. 30, 2000 and 2000-383364, filed Dec. 18, 2000. U.S. patent application Ser. No. 09/997,084 is incorporated herein in its entirety by this reference.

BACKGROUND OF THE INVENTION

The present invention relates to an infrared lamp for use in heating apparatuses and the like, and more particularly to an infrared lamp using a long-size heating element formed of a sintered body including a carbon-based substance, a method of producing the infrared lamp, and a heating apparatus using the infrared lamp.

Among heating apparatuses using the infrared lamp of the present invention, there are apparatuses for heating objects by using a heat source, that is, heating apparatuses (for example, an electric stove, a kotatsu (Japanese traditional leg and feet warming apparatus), an air conditioner, an infrared medical apparatus, etc.), drying apparatuses (for example, a clothing drier, a bedding drier, a food drier, a garbage treatment apparatus, a heating-type deodorizing apparatus, etc.). The heating apparatuses further include cooking apparatuses (for example, an oven, an oven range, an oven toaster, a toaster, a roaster, a heat retaining apparatus, a yakitori cooker (skewered chicken cooker), a cooking stove, a defroster, etc.,) hairdressing apparatuses (for example, a drier, a permanent wave heater, etc.). The heating apparatuses still further include apparatuses for fixing letters, images, etc. on sheets (apparatuses for carrying out display by using toner, for example, LBP, PPC and facsimile, and apparatuses for thermal transfer of a printed film onto an object by heating).

A tungsten wire or a nichrome wire has been principally used as the heating element of a conventional infrared lamp. Since the tungsten wire is oxidized in the air, the tungsten wire is enclosed in a quartz glass tube or the like, and the quartz glass tube is filled with an inert gas. A lamp-type heating element is produced in the above-mentioned way.

As a heating element formed of the nichrome wire, a coil-shaped nichrome wire inserted into an opaque quartz glass tube or the like for protection is produced so as to be used in the air. The electric resistance of the tungsten wire is lower in unlit state of the lamp than that in lit state, and therefore a large rush current flows at the time of turning on of the lamp. Such a rush current may adversely affects peripheral apparatuses. Furthermore, the nichrome wire has a problem of slow temperature rising speed. To solve these problems, heating elements made of carbon-based substances have been developed.

For example, Japanese Laid-open Patent Application No. Hei 10-859526 discloses a heating element formed of a sintered body made of a carbon-based substance including carbon and a metallic or semi-metallic compound (metallic carbide, metallic nitride, metallic boride, metallic silicide, metallic oxide, semi-metallic nitride or semi-metallic carbide). Accordance to an embodiment of the above-mentioned Laid-open patent application, natural graphite powder, boron nitride and a plasticizer are added to the mixture resin of a chlorinated vinyl chloride resin and a furan resin, and these ingredients are dispersed by a Henschel mixer. The ingredients are then kneaded by two rollers and pelletized by a pelletizer. Pellets obtained in this way are extruded by a screw-type extruder in the shape of a rod. The rod is dried and then fired in a nitrogen gas. Since the emissivity of carbon is close to that of a black body, it is assumed that a heating element formed of a sintered body including a carbon-based substance is an ideal heating element for the light radiation. A pure carbon material invented by Edison is known as a conventional heating element formed of carbon. However, since the carbon has a low inherent resistance, it is difficult to obtain a heating element having a high resistance. The above-mentioned prior art uses materials obtained by mixing carbon with a metallic or semi-metallic compound and by firing the mixtures. Materials obtained by this method have inherent resistances larger than that of pure carbon by several times to several ten times. An infrared lamp using a heating element formed of a sintered body including such a carbon-based substance is disclosed in Japanese Laid-open Patent Application No. Hei 11-54092. The structure of the infrared lamp is described below referring to FIG. 13, a fragmentary sectional view.

Referring to FIG. 13, a coil-shaped section 32 formed at one end of an internal lead wire 31 made of tungsten is tightly wound around one end of a resistance heating element 1 formed of a carbon-based substance. Another coil-shaped section 33 is formed in the middle of the internal lead wire 31. The other end of the internal lead wire 31 is welded to one end of a molybdenum foil 6. An external lead wire 7 is welded to the other end of the molybdenum foil 6. A metallic sleeve 34 made of an alloy of iron and nickel is fastened and fixed around the coil-shaped section 32.

There is no description regarding the temperature rise and electric resistance of the heating element formed by sintering the mixture of a carbon-based substance and a metallic or semi-metallic compound, in the Japanese Laid-open Patent Application No. Hei 10-859526. That is, a resistance-temperature characteristic thereof is not disclosed. The heating element used: for the infrared lamp disclosed in the afore-mentioned Japanese Laid-open Patent Application No. Hei 11-54092 has a negative resistance-temperature characteristic wherein its electric resistance lowers as the temperature rises. Therefore, no rush current flows at the time of turning on.

However, the afore-mentioned Japanese Laid-open Patent Application No. Hei 11-54092 does not disclose any examples of the resistance-temperature characteristic value. The resistance-temperature characteristic of a heating element is a very important factor when producing a heater. In other words, when the resistance-temperature characteristic value is unstable, it is necessary to check the characteristic value in each production lot and to change the cross-sectional area or the heating length of the heating element according to the characteristic value. The necessity of these kinds of works make impossible the mass production of infrared lamps. When heaters having a stable resistance-temperature characteristic value are produced, its absolute value is also important. In other words, no rush current flows when the electric resistance in lit state is smaller than the electric resistance in unlit state. However, since the resistance decreases as the temperature of the heating element rises, a dangerous state in which the current increases and temperature rise further is liable to occur. In other words, when the heating element deteriorates during use, this may bring a danger of decreasing the resistance further. On the other hand, when the electric resistance in lit state is high, there is no problem when the electric resistance is relatively low. However, when the electric resistance increases, the rush current flows, and there is the same problem as that in the case of the conventional lamp using a tungsten wire.

FIG. 14 is a sectional view showing an infrared lamp in accordance with another prior art.

Referring to FIG. 14, internal leads 104 extended from both ends of a heating element 120 formed of a coiled tungsten wire are welded to metallic foils 105 serving as intermediate terminal plates, thereby producing a heating element assembly 120*a*. This heating element assembly 120*a* is inserted into a quartz glass tube 101. Both ends of the quartz glass tube 101 are melted and the quartz glass tube 101 is filled with an inert gas and sealed at the metallic foils 105, thereby producing an infrared lamp.

The coil-shaped heating element 120 has a uniform radiation intensity distribution in a direction perpendicular to the axis of the coil. Therefore, it is necessary to install a reflector or the like when the heating element 120 is used for a heating apparatus for generating radiant heat in one direction. The coil-shaped heating element 120 has a hollow portion inside the coil, and clearances are present between the wires of the coil. Hence, surplus energy is consumed to radiate heat to the space.

To solve these problems, the above-mentioned Japanese Laid-open Patent Application No. Hei 11-54092 discloses another conventional infrared lamp. This infrared lamp uses a wire-shaped heating element formed of a sintered body including a carbon-based substance instead of the conventional coil-shaped heating element 120.

In the infrared lamp disclosed in the above-mentioned. Japanese Laid-open Patent Application No. Hei 11-54092, since the heating element including the carbon-based substance is used, the infrared ray emissivity of the heating element has a high value ranging from 78 to 84%. In other words, the infrared emissivity is increased by using the sintered body including the carbon-based substance as a heating element. In addition, since the heating element is wire-shaped, surplus energy released to an internal space in the case of the conventional coil-shaped heating element is not consumed. Furthermore, when the heating element is made plate-shaped, directivity can be offered to the thermal radiation intensity distribution thereof.

The infrared lamp disclosed in the above-mentioned Japanese Laid-open Patent Application No. Hei 11-54092 has the following problems.

When a heating element is made long, the long heating element is liable to hang down due to its own weight during heating. Furthermore, when the length of the heating element exceeds a certain value, pressure application during forming process may become nonuniform or may bend during sintering. Hence, the production yield of the heating element becomes low and the production cost thereof rises. It is thus difficult to form a long heating element.

Furthermore, it is also difficult to change the thermal distribution of the heating element.

BRIEF SUMMARY OF THE INVENTION

An object of the present invention is to provide a long heating element that can be produced at low cost and at a high production yield and can be used without hanging down during heating, to provide an infrared lamp using the heating element and to provide a method of producing the infrared lamp.

Another object of the present invention is to provide an infrared lamp that can change its thermal distribution so as to have excellent usability, and to provide a method of producing the infrared lamp.

Still another object of the present invention is to provide a heating apparatus having high heating efficiency by using an infrared lamp having the long heating element of the present invention.

The infrared lamp of the present invention has a carbon-based heating element that is obtained by mixing a composition having compactibility and a carbon yield of substantially nonzero after firing, with one or two kinds of metallic or semi-metallic compounds and then by firing. The change rate of the electric specific resistance of the carbon-based heating element at a high temperature in lit state of the lamp with respect to the electric specific resistance at a normal temperature in unlit state is set in the range from −20% to +20%. Lead wires are electrically connected to both ends of the carbon-based heating element, and a quartz glass tube accommodating the carbon-based heating element so that the ends of the lead wires are extended outside the quartz glass tube. The quartz glass tube is filled with an inert gas.

With this configuration, the change rate of the electric specific resistance of the carbon-based heating element at the high temperature in the lit state with respect to the electric specific resistance at the normal temperature becomes almost zero. In the case of the infrared lamp using this carbon-based heating element, no rush current flows at the time of turning on, and the resistance of the heating element does not change at the time of the expiration of its life, whereby its heating temperature does not change. It is therefore possible to provide an infrared lamp that is safe even at the time of the life expiration at which the heating element breaks.

The infrared lamp of the present invention has a long heating element comprising a plurality of short heating elements formed of a sintered body including a carbon-based substance and connected with connection terminals. A pair of electrode terminals is connected to both ends of the long heating element. One end of each electrode terminal is electrically connected to each end of the long heating element. The other end of each electrode terminal is connected to one end of an intermediate terminal plate via an internal lead wire, thereby forming a heating element assembly.

With this configuration, it is possible to easily produce an infrared lamp having a long-size heating element formed of a sintered body including a carbon-based substance by using a plurality of short heating elements that can be produced easily by sintering at low cost. As a result, it is possible to provide an infrared lamp having high infrared emissivity peculiar to the heating element formed of sintered body including a carbon-based substance, without consuming surplus energy that is radiated to an internal space in the case of a coil-shaped heating element.

An infrared lamp in another aspect of the present invention has a heating element assembly wherein electrode terminals are connected to both ends of each of a plurality of heating elements formed of a sintered body including a carbon-based substance. The heating element assembly is obtained by connecting at least one electrode terminal of a heating element to at least one electrode terminal of another heating element via a connection terminal, thereby forming a long heating element. The electrode terminals at both ends of the long heating element are connected to one ends of respective internal lead wires, and the other ends of the internal lead wires are connected to respective intermediate terminal plates.

With this configuration, it is possible to produce easily an infrared lamp having a long heating element formed of a sintered body including a carbon-based substance by using a plurality of short heating elements that can be produced easily by sintering at low cost. Furthermore, by connecting the heating elements via the electrode terminals and the connection terminals, the heating elements can be controlled and handled easily during the assembly process of the heating elements. As a result, it is possible to produce at lower cost an infrared lamp having a high infrared ray emissivity peculiar to the heating element formed of a sintered body including a carbon-based substance, without consuming surplus energy that is radiated to an internal space in the case of a coil-shaped heating element.

It is preferable that a heating element assembly having one of the above-mentioned configurations is inserted into a heat-resistant transparent glass tube (for example, preferably a quartz glass tube), that the intermediate terminal plates are sealed at the sealing portions of the heat-resistant transparent glass tube, and that the other ends of the intermediate terminal plates are connected to external lead wires extended outside the heat-resistant transparent glass tube. As a result, it is possible to realize an infrared lamp having a long heating element of which vibration of the heating element by external impact is relieved at the connection terminals and the heating element is free from hanging down or oxidation at high temperatures.

An infrared lamp in still another aspect of the present invention is an infrared lamp having one of the above-mentioned configurations, wherein the heating element assembly comprises a plurality of heating elements having heating values different from each other.

With this configuration, it is possible to realize an infrared lamp having a thermal distribution (light distribution) changed in the axial direction thereof.

An infrared lamp in still another aspect of the present invention is an infrared lamp having one of the above-mentioned configurations, wherein the cross-sectional shape of each heating element is a rectangle. The heating element is a plate-shaped heating element and the ratio of the thickness to the width of the rectangle is 1:5 or more. The direction of the longer side of the rectangular cross-section of at least one of the plurality of plate-shaped heating elements differs from those of the other plate-shaped heating elements.

With this configuration, the maximum heat radiation direction in the axial direction of the infrared lamp can be changed, and the thermal distribution in one direction can also be changed.

A method of producing an infrared lamp in accordance with the present invention comprises the steps of: connecting a connection terminal to at least one end of a plurality of heating elements formed of a sintered body including a carbon-based substance, forming one long heating element by connecting the heating element having the connection terminal to other heating elements via the connection terminals, connecting a pair of electrode terminals to both ends of the long heating element, electrically connecting one end of an internal lead wire, the other end of which is connected to one end of an intermediate terminal plate, to each of the electrode terminals, forming a heating element assembly by connecting an external lead wire to the other end of the intermediate terminal plate, inserting the heating element assembly into a heat-resistant transparent glass tube (for example, preferably a quartz glass tube), filling the heat-resistant transparent glass tube with an inert gas, melting both ends of the heat-resistant transparent glass tube and sealing the glass tube at the intermediate terminal plates of the heating element assembly.

With this production method, an infrared lamp having a long heating element formed of a sintered body including a carbon-based substance can be produced easily by using short heating elements that can be produced easily by sintering at low cost. As a result, it is possible to produce at low cost a highly efficient long infrared lamp having high infrared ray emissivity peculiar to the heating element formed of a sintered body including a carbon-based substance, without consuming surplus energy that is radiated to an internal space in the case of a coil-shaped heating element.

A method of producing an infrared lamp in another aspect of the present invention comprises the steps of: connecting electrode terminals to both ends of each of a plurality of heating elements formed of a sintered body including a carbon-based substance, forming one long heating element by connecting the electrode terminals of the heating elements connected by the electrode terminals via connection terminals, electrically connecting one end of an internal lead wire, the other end of which is connected to one end of an intermediate terminal plate, to the electrode terminal of each of both ends of the long heating element, forming a heating element assembly by connecting one end of an external lead wire to the other end of the intermediate terminal plate, and inserting the heating element assembly into the heat-resistant transparent glass tube, filling the heat-resistant transparent glass tube with an inert gas, melting both ends of the heat-resistant transparent glass tube and sealing the glass tube at the intermediate terminal plates of the heating element assembly.

With this production method, a long heating element can be produced by connecting low-cost short heating elements having electrode terminals attached in advance to both ends thereof via the connection terminals. As a result, it is possible to produce at lower cost a long infrared lamp having high infrared emissivity peculiar to the heating element formed of a sintered body including a carbon-based substance, without consuming surplus energy that is radiated to an internal space in the case of a coil-shaped heating element.

In a heating apparatus using the infrared lamp of the present invention, an object to be heated is disposed in parallel with the axial direction of the infrared lamp.

With this configuration, since the object to be heated is disposed in parallel with the longitudinal direction of a long heating element formed of a sintered body including a carbon-based substance and having high infrared ray emissivity, a long object can be heated efficiently. As a result, the heating apparatus can be used effectively for industrial heating apparatuses, such as conveyor-type heating apparatuses.

In the infrared lamp of the present invention, a carbon-based heating element is obtained by mixing a composition having compactibility and a carbon yield of substantially nonzero after firing, with one or two kinds of metallic or semi-metallic compounds and then by firing. The change rate of the electric specific resistance of the heating element in a lit state with respect to the electric specific resistance at a normal temperature is set in the range from −20% to +20%. Lead wires are electrically connected to both ends of the carbon-based heating element and sealed inside a quartz glass tube so that the ends of the lead wires are extended outside the quartz glass tube. The quartz glass tube is filled with an inert gas, thereby forming an infrared lamp.

In the infrared lamp using this carbon-based heating element, the change rate of the electric specific resistance of the carbon-based heating element in lit state with respect to the electric specific resistance at a normal temperature becomes almost zero. Hence, no rush current flows at the time of turning on. In addition, the resistance of the heating element does not change at the time of the expiration of its life. Even immediately before the breakage of the heating element, its temperature does not change significantly. Hence, no dangerous condition occurs at the time of the breakage of the heating element. It is therefore possible to provide a safe infrared lamp.

The metallic or semi-metallic compound in the carbon-based heating element of the present invention is metallic carbide, metallic boride, metallic silicide, metallic nitride, metallic oxide, semi-metallic nitride, semi-metallic oxide or semi-metallic carbide. The carbon-based heating element includes one or two kinds of the above-mentioned substances.

A carbon-based heating element having a desired inherent resistance can be formed by including one or two kinds of the above-mentioned substances and by changing the mixture ratio of the substances and by changing the shape and length of the carbon-based heating element. In particular, when silicon carbide, boron carbide or boron nitride is used, the resistance can be controlled easily, and a preferable carbon-based heating element can be formed. Infrared lamps having various power consumption values can be produced easily by using the carbon-based heating element of the present invention.

The above-mentioned composition in the infrared lamp using the carbon-based heating element including resins uses an organic material that is carbonized when fired in an inert gas atmosphere. Effective organic materials are as follows: thermoplastic resins, such as polyvinyl chloride, polyacrylonitrile, polyvinyl alcohol, copolymer of polyvinyl chloride and polyvinyl acetate and polyamide, and heat-hardening resins, such as a phenol resin, a furan resin, an epoxy resin and an unsaturated polyester resin.

In an infrared lamp using a heating element formed of a carbon-based substance including these materials, the surface of the heating element is made of a carbon material. Hence, the emissivity of the heating element during heating is nearly close to that of a pure carbon material, that is, 0.87. As a result, high radiation efficiency can be realized, and it is possible to obtain an infrared lamp most suitable for heating, cooking, heat retaining, drying, firing and decocting, and also most suitable for use in medical apparatuses.

The above-mentioned composition of the present invention includes one, two or more kinds of carbon powder selected from among carbon black, graphite and coke powder. In the infrared lamp using the carbon-based heating element including the above-mentioned composition, the heating element includes carbon powder. Hence, the emissivity of the infrared lamp is close to that of graphite just as described above. Furthermore, its radiant heat is close to that of a conventional charcoal fire. When the infrared lamp is used for cooking, delicious dishes can be obtained. Graphite powder is particularly preferable as a substance to be included.

In the infrared lamp of the present invention, the lead wires are electrically connected to the current-passing portion of the carbon-based heating element. The connection is carried out via members having an inherent resistance smaller than that of the carbon-based heating element and larger than that of the lead wire. The heating element is inserted into a quartz glass tube so that the ends of the lead wires are extended outside the quartz glass tube, and the quartz glass tube is filled with an inert gas. The infrared lamp of the present invention uses a heating element, the change rate of the electric specific resistance in lit state with respect to the electric specific resistance at a normal temperature is set in the range from −20% to +20%, preferably −10% to +10%. Hence, rush current hardly flows, and temperature rise does not occur even when the heating element deteriorates. It is therefore possible to realize an infrared lamp that is safe even immediately before the breakage of the carbon-based heating element.

Furthermore, since the member having a small resistance is disposed-between the heating element and the lead wire connected thereto, the member functions as a heat radiation section. Hence, the lead wire is prevented from being heated to high temperatures. In addition, the member is prevented from deteriorating and from reacting with a carbon material. As a result, it is possible to realize a highly reliable infrared lamp. A preferable shape of the member is a circle, because the connection to the member can be attained by winding the lead wire around the member.

In the infrared lamp of the present invention, rush current hardly flows. It is possible to provide an infrared lamp that is safe even at the expiration of its life. Furthermore, when a member having a small inherent resistance and high thermal conductivity is disposed between the heating element and the lead-wire, the temperature rise at the joint portion of the lead wire can be suppressed. It is therefore possible to provide an infrared lamp having high reliability at the joint portion.

When the member is made cylindrical, it can be built in the infrared lamp regardless of whether the heating element is plate-shaped or wire-shaped. In other words, a slit is formed in the member and a plate-shaped heating element is inserted therein, or a round hole is formed in the member and a wire-shaped heating element is inserted therein so as to be joined thereto. The internal lead wire is wound around the cylindrical member so as to keep tight fit. With this configuration, it is possible to realize an infrared lamp having high reliability at the joint portion and comprising a heating element having a desired shape.

In an infrared lamp in still another aspect of the present invention, the member is made of a carbon-based substance, the inherent resistance of which is smaller than that of the carbon-based heating element and larger than that of the lead wire. The member is formed of a carbon-based substance, preferably graphite. Hence, the electrical conductivity of the carbon-based heating element is close to that of a metal and its thermal conductivity is high. Therefore, reliability at the joint portion of the lead wire is high. Furthermore, since the member has a high thermal conductivity, the member functions as a heat radiation member. Hence, the member can prevent the temperature rise at the joint portion of the lead wire. It is thus possible to obtain an infrared lamp having a long life.

In an infrared lamp in still another aspect of the present invention, the lead wire is a tungsten wire, a molybdenum wire or a stainless steel wire. Since the lead wire connected to the carbon-based heating element or the carbon-based member is made of a material having a high melting point and high rigidity, such as tungsten, molybdenum or stainless steel, the tight fitting winding condition of the lead wire can be maintained for a long period of time. The deterioration of the spring elasticity of the stainless steel wire at high temperatures is less than that of the tungsten wire or molybdenum wire. Hence, the stainless steel wire is suited for a high-power infrared lamp in which temperature rise occurs at the lead wire wound portion.

In an infrared lamp in still another aspect of the present invention, a coil spring portion having a diameter almost close to the inside diameter of the quartz glass tube is provided in the middle portion of one or both of the lead wires connected to the carbon-based heating element so that a tension force is applied to the carbon-based heating element. Since the diameter of the coil spring portion is close to the inside diameter of the quartz glass tube, the heating element can be held at the central portion of the quartz glass tube. Furthermore, since the coil spring portion applies the tension force to the heating element, the heating element is prevented from becoming longer and bending due to thermal expansion in lit state. Since the tension force is applied at all times, it is possible to realize an infrared lamp highly resistant against vibration and impact.

In an infrared lamp in still another aspect of the present invention, the quartz glass tube of the infrared lamp is filled with argon or nitrogen, or a mixture gas of argon and nitrogen.

Since the sealed quartz glass tube is filled with argon or nitrogen, or a mixture gas of those, arc discharge hardly occurs, and the heating element made of a carbon-based substance is not oxidized. Hence, it is possible realize an infrared lamp having a long life. The internal pressure of the gas enclosed in the quartz glass tube should preferably be lower than the atmospheric pressure. In other words, it is preferable that the pressure of the gas is adjusted at the time of sealing so that the internal pressure becomes slightly lower than the atmospheric pressure even when the temperature of the inside of the quartz glass tube becomes high in the lit state.

In the infrared lamp having the configuration in accordance with the present invention, it is possible to select a heating element having a very low resistance change rate at start. In addition, in the sectional structure of the sintered body used for the heating element, more carbon is contained in the surface layer than in the inside of the heating element. This increases the amount of radiation light radiated from the carbon as a component of the above-mentioned combined radiation light.

As a result, the emissivity of the heating element is closer to that of a black body than that of the conventional heating element having inorganic filler exposed in the surface layer thereof, thereby being almost close to the emissivity of carbon.

Furthermore, the thermal efficiency of the infrared lamp of the present invention is improved, since the infrared radiation intensity at a peak wavelength of 2 to 3 μm is high. Moreover, since the absorption wavelengths of water and organic substances are 2 to 3 μm, organic substances and moisture-including substances are absorbed more significantly. Hence, organic substances and moisture-including substances can be warmed by using lower energy. In particular, the infrared lamp of the present invention is very effective in drying moisture and organic substances, such as various foods, human skin and paints.

The warming apparatus of the present invention is provided with a plurality of infrared lamps having the above-mentioned configuration at the upper, lower or side position of the housing of the apparatus or at the plurality of positions of the housing.

This warming apparatus is provided with an infrared lamp having high infrared ray emissivity at a wavelength close to the absorption wavelengths of organic substances and water. Hence, when the apparatus is used for human body warming apparatuses, such as heaters, saunas, kotatsu, foot warmers and warming/drying apparatuses for bathrooms and changing rooms, wherein radiant heat is used for warming, skin warming speed increases.

The warming apparatus is far more effective than conventional heaters, such as a nichrome wire heater and a quartz heater in which a tungsten wire coil is sealed, as a matter of course.

The drying apparatus of the present invention is provided with a plurality of infrared lamps having the above-mentioned configuration at the upper, lower or side position of the housing of the apparatus or at the plurality of positions of the housing.

This drying apparatus is provided with an infrared lamp having high infrared ray emissivity at a wavelength close to the absorption wavelengths of organic substances and water. Hence, the drying apparatus is suited for warming water. As a result, the drying apparatus is highly effective in drying water-washed photographic paper, clothing, dishes, bedding, paint including organic solvent, printed matter, washed PC boards, etc.

The heating apparatus of the present invention is provided with a plurality of infrared lamps having the above-mentioned configuration at the upper, lower or side position of the housing of the apparatus or at the plurality of positions of the housing.

This heating apparatus is provided with an infrared lamp having high infrared ray emissivity at a wavelength close to the absorption wavelengths of organic substances and water. Hence, the heating apparatus is suited for heating substances including large amounts of organic substances and moisture.

For example, when the apparatus is used for drinking water heaters, aquarium heaters, defrosters in refrigerators, heating apparatuses for water heaters and garbage processing apparatuses, toner fusing heaters for LBP, PPC and PPF copiers wherein images are printed on paper by the fusion of organic substances, food heaters, etc., the heating speed of the apparatus can be made higher than those of other heat sources, thereby saving energy.

In addition, according to the result of experiments wherein the infrared lamp of the present invention is used for food heaters, such as a yakitori cooker (skewered chicken cooker), scorched portions on the surface do not expand, and food is heated to the inside. It is thus verified that heating can be attained without losing good taste.

The warmth-maintaining apparatus of the present invention is provided with a plurality of infrared lamps having the above-mentioned configuration at the upper, lower or side position of the housing of the apparatus or at the plurality of positions of the housing.

This warmth-maintaining apparatus is provided with an infrared lamp having high infrared ray emissivity at a wavelength close to the absorption wavelengths of organic substances and water. Hence, the warmth-maintaining apparatus has a high warmth-maintaining effect and is suited for maintaining the warmth of food. For example, the apparatus is best suited for delivery carts (vehicles for carrying prepared meals in hospitals or the like) and also best suited to maintain the warmth of meat buns, sausages, grilled yakitori (skewered chicken), takoyaki (round flour dumplings with octopus), etc. When the apparatus was used for a yakitori warmth-maintaining apparatus, it was verified that the apparatus was 5% more energy-efficient than an apparatus comprising a conventional infrared lamp using a heating element formed by sintering a carbon-based substance.

Moreover, it was recognized that the apparatus was about 30% more energy-efficient than conventional apparatuses, such as a nichrome wire heater, a quartz lamp and a halogen lamp. Besides, the apparatus is excellent in heating speed, whereby the full-power state of the apparatus can be attained in about five seconds. In the case of conventional heaters, such as a sheath heater and a nichrome wire heater, however, it takes 1 to 5 minutes until the full-power state is attained. Hence, the apparatus of the present invention is also highly effective in energy saving. This effect was recognized in not only the warmth-maintaining apparatuses but also other apparatuses, such as drying and heating apparatuses. This can be explained that the apparatuses are commonly used to process substances including water or organic substances.

The cooking apparatus of the present invention is provided with a plurality of infrared lamps having the above-mentioned configuration at the upper, lower or side position of the housing of the apparatus or at the plurality of positions of the housing.

This cooking apparatus is provided with an infrared lamp having high infrared ray emissivity at a wavelength close to the absorption wavelengths of organic substances and water. Hence, the cooking apparatus is suited for heating and cooking foods. For example, when the apparatus is used for home use and industrial food heating and booking apparatuses, such as microwave ovens with food heaters, fish roasters, toasters, oven ranges for heating foods, yakitori cookers, industrial hamburger cookers, etc., the apparatus can be more energy-efficient than conventional apparatuses using other heat sources.

In addition, infrared rays reach the inside of food as described above. The food can thus be cooked without scorching on the surface. Furthermore, since the most of the surface of the heating element is formed of carbon, the emissivity of the surface is 0.85, almost close to that of carbon. Hence, it was recognized that the taste of the food was close to that cooked by using a charcoal fire.

The medical apparatus of the present invention is provided with a plurality of infrared lamps having the above-mentioned configuration at the upper, lower or side position of the housing of the apparatus or at the plurality of positions of the housing.

This medical apparatus is provided with an infrared lamp having high infrared ray emissivity at a wavelength close to the absorption wavelengths of human skin, i.e., an organic substance. Hence, the medical apparatus has a high warming effect and is suited for medical warming apparatuses.

When the apparatus was applied to an infrared treatment apparatus for example, it was recognized that the apparatus provided abundant warmth and that the apparatus was highly effective when compared with conventional apparatuses by using thermography.

DETAILED DESCRIPTION OF THE INVENTION

Figure 1:
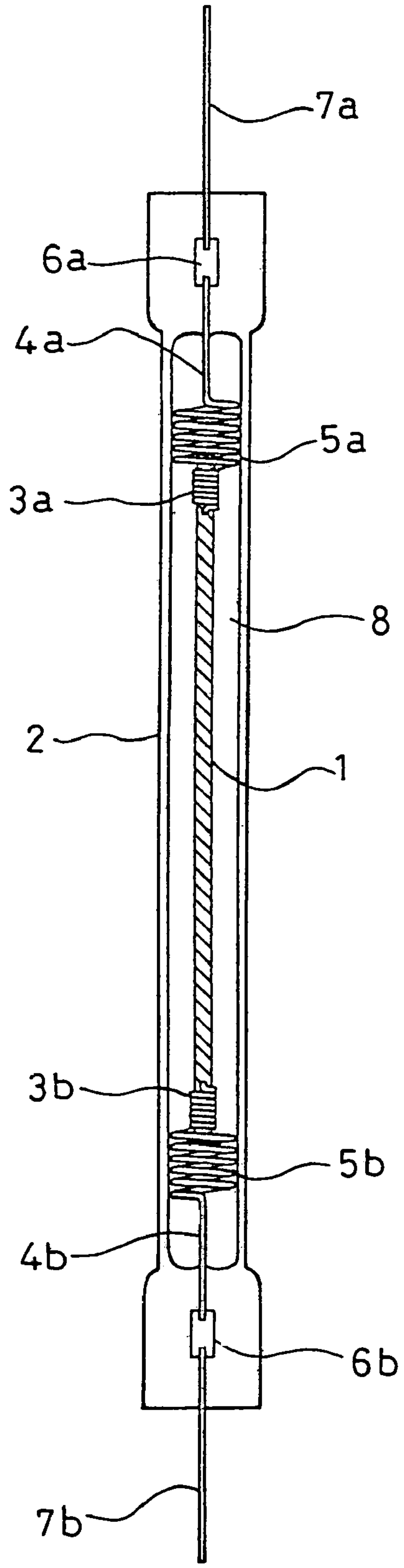
FIG. 1 is a sectional view showing an infrared lamp using a wire-shaped carbon-based heating element in a second embodiment of the present invention.

Preferred embodiments of an infrared lamp, a method of manufacturing the infrared lamp, and a heating apparatus using the infrared lamp in the present invention will be described below referring to the accompanying drawings.

Materials, sizes, production methods, heating apparatuses, etc. in accordance with embodiments described below are only examples preferable as the embodiments of the present invention. Hence, it should be understood that the applicable range of the present invention is not limited by these embodiments.

The embodiments of the present invention will be described below referring to FIG. 1 to FIG. 12B.

[First Embodiment]

Description is made as to a resistance heating element made of a carbon-based material and used for an infrared lamp in a first embodiment of the present invention.

A carbon-based heating element serving as a resistance heating element is made of a sintered body including a carbon-based substance manufactured as described below. First, 45 parts by weight of a chlorinated vinyl chloride resin is mixed with 15 parts by weight of a furan resin, thereby producing a mixture A. Next, 10 parts by weight of natural graphite fine powder (having an average granularity of 5 μm) is mixed with 60 parts by weight of the above-mentioned mixture A, thereby producing a mixture B. Thirty (30) parts by weight of boron nitride (having an average granularity of 2 μm), 70 parts by weight of the above-mentioned mixture B and 20 parts by weight of diallyl phthalate monomer (plasticizer) are dispersed and mixed, thereby producing a mixture C. The mixture C is extruded by an extruder to have a wire-shaped material. This wire-shaped material is fired for 30 minutes in a firing furnace at 1000°

C. in a nitrogen atmosphere, thereby obtaining a carbon-based heating element for this embodiment. Heating up to about 1000° C., preferably up to about 2000° C., in an inert atmosphere or in a vacuum may be applicable as another firing condition for the heating element. The temperature is raised from room temperature to 500° C. at a rate of temperature rise of 3 to 100° C./h, preferably 5 to 50° C./h. The temperature is then raised further from 500° C. to 1000° C. or 2000° C. at a rate of temperature rise of 50 to 200° C./h. The temperature is maintained for 3 to 10 hours to carry out firing.

The obtained carbon-based heating element has the shape of a wire having a diameter of 1.50 mm and a length of 500 mm, for example. This wire-shaped carbon-based heating element is reheated in a vacuum of $1\times10^{-2}$ Pa or less. The heat treatment temperature for this reheating is in the range of 1500° C. to 1900° C., which are listed in the left column of TABLE 1. The carbon-based heating element produced as described above is used to form an infrared lamp having a configuration shown in FIG. 1, and the resistance-temperature characteristic of the heating element is measured. When 100 V AC is applied to the infrared lamp, the color temperature of the carbon-based heating element is 1200° C.

Electric specific resistance ρ at 20° C. and 1200° C. can be obtained by equation (1) shown below.

$$\rho = RS/L \tag{1}$$

ρ: Electric specific resistance (Ωcm)

R: Electric resistance (Ω)

S: Cross-sectional area of heating element ($cm^2$)

L: Length of heating element (cm)

By using this equation (1), the electric specific resistance ρ is measured at 20° C. and 1200° C. as to the infrared lamps produced by using carbon-based heating elements reheated at temperatures listed in TABLE 1. The temperatures 20° C. and 1200° C. are color temperatures on the surface of each carbon-based heating element. Subsequently, the change rate of the electric specific resistance at 1200° C. with respect to the electric specific resistance at 20° C. (hereafter simply referred to as "change rate") was obtained on the basis of experiments.

TABLE 1 shows the electric specific resistances of the resistance heating elements made of a sintered body including a carbon-based substance and reheated at different heat treatment temperatures, and the changes of the electric specific resistances from at 20° C. to that at 1200° C. obtained in accordance with experiments.

TABLE 1

| Reheating treatment | Electric specific resistance ρ (Ω cm) | | Changes of specific resistance at 1200° C. from that of the values at |
|---|---|---|---|
| Temperature(° C.) | 20° C. | 1200° C. | 20° C.(%) |
| 1500 | 0.0198 | 0.0147 | −25.7% |
| 1600 | 0.0181 | 0.0143 | −20.8% |
| 1700 | 0.0126 | 0.0111 | −11.9% |
| 1800 | 0.0079 | 0.00844 | 6.8% |
| 1900 | 0.00609 | 0.00689 | 13.2% |

As shown in TABLE 1, the change rates are negative at the reheating treatment temperatures of 1500 to 1700° C. In other words, the electric specific resistances at 1200° C. are smaller than those at 20° C. As the reheating treatment temperature rises, the change rate changes in the positive direction. The change rate becomes 0% in the vicinity of the reheating treatment temperature of 1800° C. At heating treatment temperatures of 1800° C. or more, the change rate is positive. In other words, the electric specific resistances at 1200° C. become larger than those at 20° C.

According to the results of the experiments, it is found that the change of the electric specific resistance with respect to the value at 20° C. can be adjusted by selecting the heat treatment temperature during the reheating of the carbon-based heating element in a vacuum. It is also found that the reheating treatment makes the carbon-based heating element possible to have the resistance-temperature characteristic in which the change of the electric specific resistance at 1200° C. (high temperature) with respect to the value at 20° C. (room temperature) approximates to 0%. The resistance-temperature characteristic of an infrared lamp using this carbon-based heating element becomes flat. Furthermore, a carbon-based heating element having a change rate other than 0% can also be easily produced by selecting the reheating temperature as necessary. Hence, an infrared lamp having a particular specification, such as, a non-flat resistance-temperature characteristic, can also be produced easily.

Next, experiments similar to those in the case of TABLE 1 are carried out for plate-shaped carbon-based heating elements at different reheating temperatures, and results are shown in TABLE 2.

TABLE 2

| Reheating treatment | Electric specific resistance ρ (Ω cm) | | Changes of specific resistance at 1200° C. from that of the values at |
|---|---|---|---|
| Temperature(° C.) | 20° C. | 1200° C. | 20° C.(%) |
| 1300 | 0.025 | 0.0184 | −26.4% |
| 1400 | 0.0213 | 0.0162 | −23.9% |
| 1500 | 0.0154 | 0.0135 | −12.3% |
| 1600 | 0.0103 | 0.0104 | 0.9% |
| 1700 | 0.0059 | 0.0063 | 6.8% |
| 1800 | 0.0038 | 0.0044 | 15.8% |

TABLE 2 indicates the results of experiments for obtaining the change rates of the electric specific resistances of the plate-shaped carbon-based heating elements with respect to the values at 20° C. depending on different reheating treatment temperatures.

The plate-shaped carbon-based heating elements for the experiments were produced to have the same composition and in the same production conditions as those for the above-mentioned wire-shaped heating elements. The carbon-based heating elements have the shape of a plate measuring 6.1 mm in width and 0.5 mm in thickness after firing. The wire-shaped and plate-shaped carbon-based heating elements can be produced by changing the shape of the die of the extruding portion of an extruder.

The plate-shaped carbon-based heating elements having been sintered were reheated a temperature in the range of 1300° C. to 1800° C. in a vacuum of $1\times10^{-2}$ Pa or less. Each of the heating elements was built in the infrared lamp shown in FIG. 2. The electric specific resistances of the heating elements were measured at 20° C. and 1200° C., and the changes of the electric specific resistances from that at 20° C. to that at 1200° C. were obtained. TABLE 2 shows the results. As shown in TABLE 2, when the heat treatment temperature is lower than 1600° C., the change rates were negative. When reheating is carried out at 1600° C. or higher temperatures, the change rates become positive. As the reheating treatment temperature rises, the change rates become larger positive values.

According to TABLE 2, the change rate becomes negative when the treatment temperature is lower than 1600° C. The change rate becomes positive when the treatment temperature is 1600° C. or higher. This tendency is similar to that shown in TABLE 1. However, it is found that the reheating treatment temperature at which the change rate becomes zero differs depending on the shape, composition, production conditions, etc. of the carbon-based heating element.

It is important that the reheating treatment temperature at which the change rate becomes zero is determined by the composition and shape of the carbon-based heating element. When the reheating treatment is carried out at a specified reheating temperature, it is possible to obtain an ideal carbon-based heating element having a change rate of zero. When the change rate is close to zero, no rush current flows at the time of turning on of the infrared lamp, and the resistance of the carbon-based heating element does not change while its temperature rises. Hence, the carbon-based heating element has a temperature self-maintaining function wherein its temperature is maintained constant. As a result, it is possible to provide a safer infrared lamp by using the carbon-based heating element.

In this embodiment, the experiments are carried out at the temperature of 1200° C. in the lit state of the infrared lamp. However, it has been verified that the results of this embodiment are applicable at temperatures lower or higher than the temperature of 1200° C. A heating element having a change rate of zero is the most desirable as a heating element for a general infrared lamp. In the embodiment, heating elements having more negative or positive resistance-temperature characteristics can also be realized as heating elements having special specifications by simply changing the reheating temperature.

The range of the change rate applicable to the infrared lamp of the present invention is from −20% to +20%, and the most suitable range is from −10% to +10%. In other words, an infrared lamp can be designed regardless of the resistance-temperature characteristic of a carbon-based heating element when the range the change rate is from −10% to +10%. In addition, when the change rate is in this range, the resistance at room temperature is close to that in heating state even when the change rate is negative. Hence, no excessive current flows when the infrared lamp turns on. Furthermore, it is possible to easily produce an infrared lamp having allowable tolerances in the practical performance thereof.

[Second Embodiment]

A second embodiment of the present invention relates to a carbon-based heating element having a change rate smaller than that of the carbon-based heating element of the first embodiment. Description is made as to an infrared lamp using a carbon-based heating element which has a small change rate with respect to the value at 20° C. with reference to FIG. 1.

FIG. 1 is a sectional view showing an infrared lamp in the second embodiment. Referring to FIG. 1, the carbon-based heating element of the infrared lamp is reheated at 1800° C. as shown in TABLE 1 of the first embodiment, thereby producing a wire-shaped carbon-based heating element 1 having a diameter of 1.55 mm, made of a sintered body including a carbon-based substance and having a change rate of 6.8%. Internal lead wires 4*a* and 4*b* each formed of a molybdenum wire are attached to respective ends of the carbon-based heating element 1 at coil-shaped portions 3*a* and 3*b* formed at ends of the internal lead-wires 4*a* and 4*b* so as to be screw-connected to the ends of the carbon-based heating element 1 with tight fit.

The internal lead wires 4*a* and 4*b* have coil spring portions 5*a* and 5*b*, respectively, each having at least one turn. The other ends of the internal lead wires 4*a* and 4*b* are connected to one ends of molybdenum foils 6*a* and 6*b* having a thickness of 20 μm, respectively. External lead wires 7*a* and 7*b* each formed of a molybdenum wire are welded to the other ends of the molybdenum foils 6*a*, 6*b*, respectively. This assembly configured as mentioned above is inserted into a transparent quartz glass tube 2. The quartz glass tube 2 is melted and sealed at both ends, that is, at the portions of the molybdenum foils 6*a* and 6*b*.

The quartz glass tube 2 is filled with argon gas of an inert gas at a pressure below atmospheric pressure. This infrared lamp uses the carbon-based heating element 1 whose change rate of the electric specific resistance with respect to the value at 20° C. is 6.8% which is in the neighborhood of zero, and therefore, a rush current hardly flows at the time of turning on of the infrared lamp, and interference due to noise is not given to peripheral apparatuses.

Furthermore, the infrared lamp was subjected to a life test wherein the lamp was lit continuously or intermittently in an overvoltage condition at a voltage of 120 V, 130 V, 150 V or 200 V which are higher than the rated voltage of 100 V. As a result, immediately before breakage of the heating element 1 in the life test, the resistance of the carbon-based heating element 1 did not increase or decrease significantly, but its current value increased slightly and its heating temperature rose slightly.

In comparison with this, another life test was carried out in the above-mentioned conditions by using a carbon-based heating element whose change rate is −23.9%. The resistance of this heating element having the change rate of −23.9% decreased significantly immediately before breakage. Its temperature increased by 200° C. or more, and breakage occurred. When the temperature rises immediately before the expiration of the life and the breakage, the heating element becomes soft, hangs down and makes contact with the inner wall of the quartz glass tube. As a result, the quartz glass tube may melt or may burst at worst. This occurs because the change rate is negative. On the other hand, when the change rate is positive and more than 20% such a change rate is undesirable, because the rush current becomes non-negligible.

[Third Embodiment]

An infrared lamp in a third embodiment of the present invention will be described below referring to FIG. 2 and FIG. 3. In the infrared lamp of the present embodiment, the heating element 11 is a sintered body including a carbon-based substance which is reheated at 1600° C. The change rate is 0.9% as shown in TABLE 2 of the first embodiment. Description is made as to a heating element 11 which is obtained by processing this sintered body into the shape of a plate measuring a width w of 6.1 mm, a thickness t of 0.5 mm and a length L of 300 mm.

Figure 2:
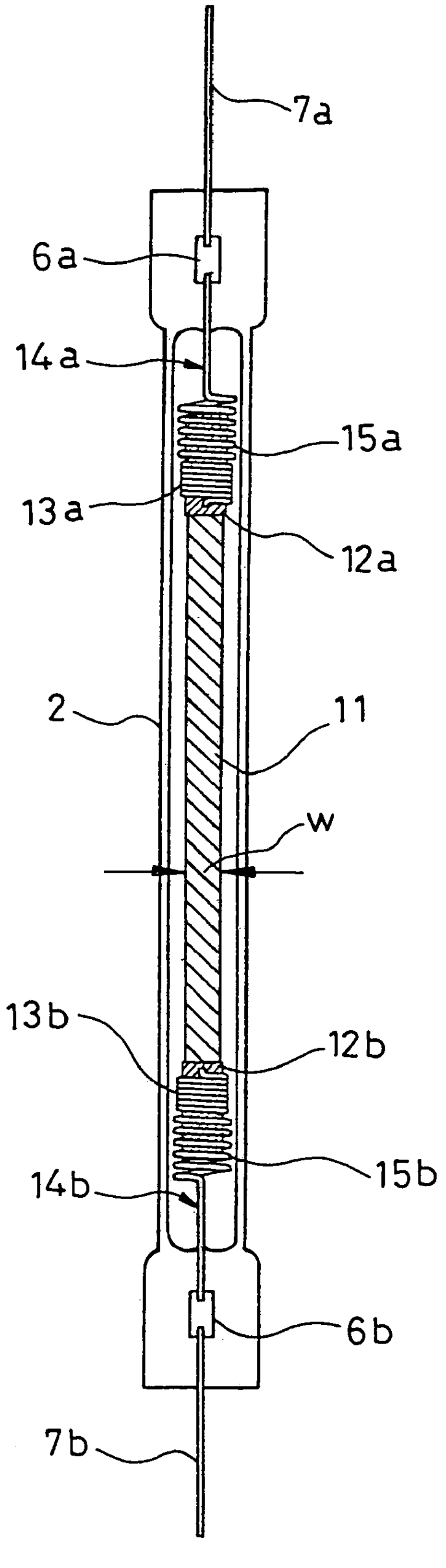
FIG. 2 is a sectional view showing an infrared lamp using a plate-shaped carbon-based heating element in a third embodiment of the present invention.
Figure 3:
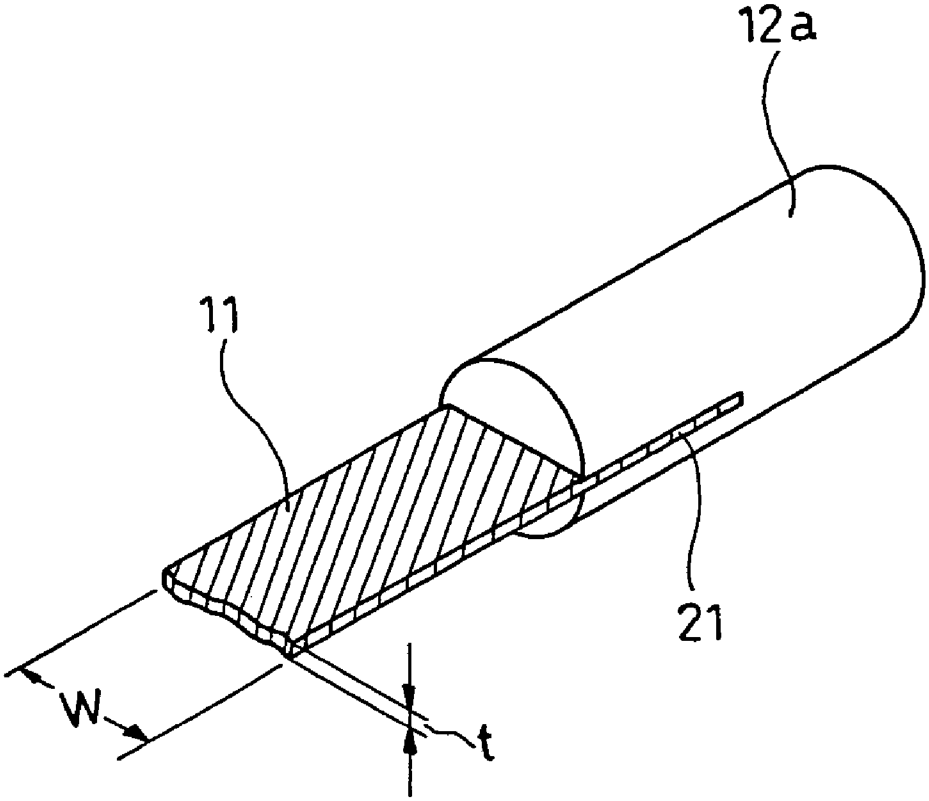
FIG. 3 is a perspective view showing a connection structure at an end of the carbon-based heating element of the infrared lamp shown in FIG. 2.

Referring to FIG. 2, cylindrical members 12*a* and 12*b* made of a carbon-based substance such as graphite are joined to both ends of the plate-shaped heating element 11, respectively. The specific resistance of the cylindrical member is smaller than that of the carbon-based heating element and larger than that of the lead wire. FIG. 3 shows an example of the detailed structure of the joint portion of the cylindrical members 12*a*, 12*b*. A slit 21 slightly larger than the thickness of the plate-shaped heating element 11 is formed at one end of the cylindrical member 12*a*. The heating element 11 is inserted into the slit 21 and joined thereto by using a carbon-based adhesive.

The carbon-based adhesive is a paste obtained by blending fine graphite powder with an organic resin. This carbon-based adhesive is applied to the heating-element 11, and the heating element 11 is inserted into the slit 21. After being dried, the adhesive is fired at 1000° C. or more in an inert atmosphere, whereby the organic resin is carbonized to attain joining. As shown in FIG. 2, coil-shaped portions 13*a* and 13*b* formed at one ends of internal lead wires 14*a* and 14*b* each formed of a molybdenum wire are wound around the cylindrical members 12*a* and 12*b*, respectively, so that a tight fit can be obtained. The internal lead wires 14*a* and 14*b* have coil spring portions 15*a* and 15*b*, respectively.

The outside diameter of the coil spring portions 15*a* and 15*b* is slightly smaller than the inside diameter of the quartz glass tube 2. Hence, the heating element 11 is held by the coil spring portions 15*a* and 15*b* at a nearly central position in the quartz glass tube 2. The other ends of the internal lead wires 14*a* and 14*b* are connected to one ends of the rectangular molybdenum foils 6*a* and 6*b* having a thickness of 20 μm, respectively. The external lead wires 7*a* and 7*b* each formed of a molybdenum wire are spot-welded to the other ends of the molybdenum foils 6*a* and 6*b*, respectively.

This assembly configured above is inserted into the transparent quartz glass tube 2. After the air in the quartz glass tube 2 is replaced with an argon gas, the quartz glass tube 2 is melted and sealed at both ends, that is, at the portions of the molybdenum foils 6*a* and 6*b*. When the quartz glass tube 2 is melted and sealed at both ends at the portions of the molybdenum foils 6*a* and 6*b*, a slight tension is applied to the coil spring portions 15*a* and 15*b*. As a result, the carbon-based heating element 11 receives a slight tension at all times. Consequently, the carbon-based heating element 11 is prevented from hanging down due to its thermal expansion during heating. Furthermore, even when vibration or impact from the outside to the infrared lamp is applied to the heating element 11, the vibration or impact is absorbed by the coil spring portions 15*a* and 15*b*. It is thus possible to realize an infrared lamp highly resistant against vibration and impact.

When a voltage of 100 V was applied to the infrared lamp formed as described above, the temperature of the carbon-based heating element 11 reached about 1100° C. after about 8 seconds. Since the plate-shaped carbon-based heating element 11 having a change rate of 0.9% was used, rush current was zero. In addition, the infrared lamp was subjected to a life test wherein the lamp was lit continuously or intermittently at a voltage of 130 V, 150 V or 200 V. In all the test conditions, the resistance of the carbon-based heating element 11 increased slightly and the color temperature of the radiated light lowered slightly immediately before the expiration of the life of the carbon-based heating element 11.

It is thus found that rush current hardly flows in the infrared lamp of this embodiment using the carbon-based heating element 11 subjected to reheating, and that the infrared lamp can be used safely. Furthermore, since the plate-shaped carbon-based heating element 11 is inserted into the slits 21 of the cylindrical members 12*a* and 12*b* and joined thereto, it is possible to obtain a highly reliable infrared lamp.

Since the cylindrical member 12*a* and 12*b* are made of a carbon-based substance, preferably graphite, they are high in thermal conductivity and function as heat radiating blocks. Hence, the heat at the fitting portions of the internal lead wires 14*a* and 14*b* is radiated through the cylindrical member 12*a* and 12*b*, and the temperature at the fitting portions is prevented from rising. The reliability of the fitting portions is therefore improved drastically.

The above-mentioned joint method is also applicable to the wire-shaped carbon-based heating element 1 in the first embodiment without problems. Still further, in the case of a wire-shaped carbon-based heating element having low power consumption, the internal lead wires 14*a* and 14*b* may be directly connected to the carbon-based heating element without problems.

[Fourth Embodiment]

An infrared lamp in accordance with a fourth embodiment of the present invention will be described below referring to FIG. 4, a sectional view. In the fourth embodiment, a carbon-based heating element subjected to reheating is also used in a similar manner to that of the previous embodiments.

Figure 4:
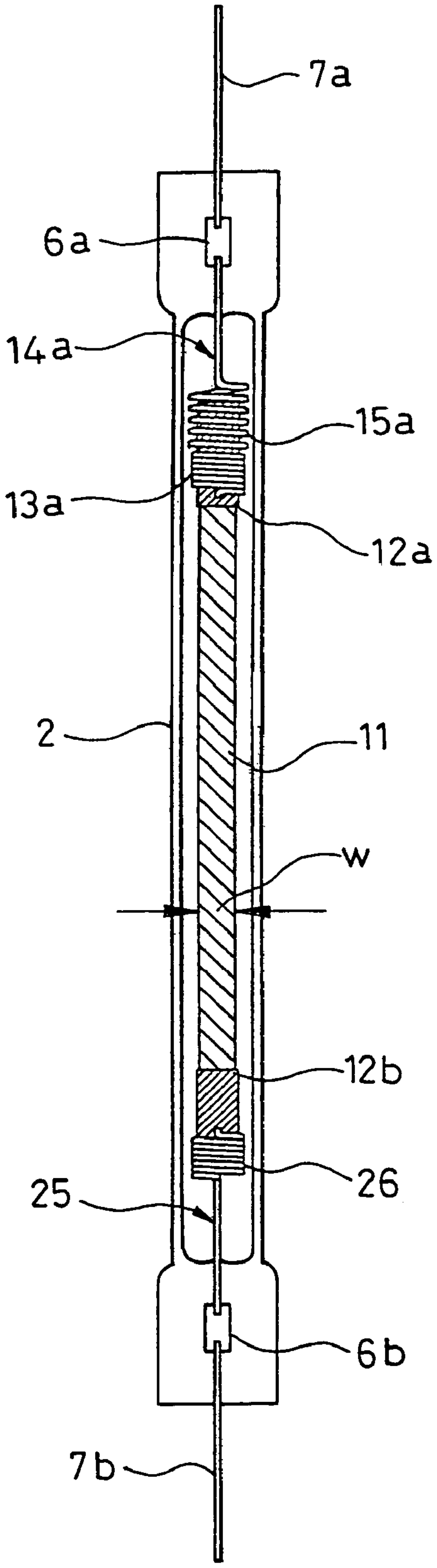
FIG. 4 is a sectional view showing an infrared lamp using a plate-shaped carbon-based heating element in a fourth embodiment of the present invention.

Referring to FIG. 4, the cylindrical members 12*a* and 12*b*, formed of graphite and similar to those shown in FIG. 2, are joined to both ends of the plate-shaped carbon-based heating element 11 measuring a width w of 6.1 mm and a thickness t of 0.5 mm, respectively. The coil-shaped portion 13*a* formed at one end of the internal lead wire 14*a* of a molybdenum wire is wound around the cylindrical members 12*a* so as to attain tight fitting.

The coil spring portion 15*a* is formed at the middle portion of the internal lead wire 14*a*. A coil-shaped portion 26 is formed at one end of an internal lead wire 25 formed of a molybdenum wire, and the coil-shaped portion 26 is wound around the other cylindrical member 12*b* so as to attain tight fitting.

The internal lead wire 25 does not have such a portion as the coil spring portion 15*a* of the internal lead wire 14*a*. The assembly configured as mentioned above is inserted into the transparent quartz glass tube 2. The quartz glass tube 2 is melted and sealed at both ends, that is, at the portions of the molybdenum foils 6*a* and 6*b*. The quartz glass tube 2 is filled with an argon gas at a pressure below atmospheric pressure.

Since the internal lead wire 25 has no coil spring portion in the configuration of this embodiment, the amount of the use of an expensive molybdenum wire is reduced, and the cost of the infrared lamp is lowered. The outside diameter of the coil spring portion 15*a* is close to the inside diameter of the quartz glass tube 2. Hence, the heating element 11 is held at the central position inside the quartz glass tube 2, just as in the case of the configuration shown in FIG. 2. Since the quartz glass tube 2 is sealed while a slight tension is applied to the coil spring portion 15*a*, the heating element 11 is subjected to the tension at all times. The heating element 11 is prevented from hanging down, and the coil spring portion 15*a* absorbs vibration and impact applied externally.

In the above-mentioned embodiments, the internal lead wires 4*a*, 4*b*, 14*a* and 14*b* are each formed of a molybdenum wire. However, a tungsten wire can also be used without problems. Furthermore, a stainless steel wire being more excellent in spring performance at high temperatures than molybdenum and tungsten wires is effectively used for an infrared lamp wherein the temperature of the cylindrical members 12*a* and 12*b* formed of graphite becomes 550° C. or more.

In the above-mentioned cases, a wire is used as each of the internal lead wires. However, a thin plate made of tungsten, molybdenum, stainless steel or the like is also applicable instead of the wire.

Furthermore, an opaque quartz glass tube can be used instead of the transparent quartz glass tube 2 without problems. Still further, a quartz glass tube obtained by polishing the surface of the quartz glass tube 2 by blasting is also applicable.

Moreover, a carbon-based heating element having a change rate other than zero can also be produced easily by selecting the reheating temperature. Hence, an infrared lamp having a special specification, that is, a non-flat resistance temperature characteristic, can also be produced easily.

[Fifth Embodiment]

Figure 5:
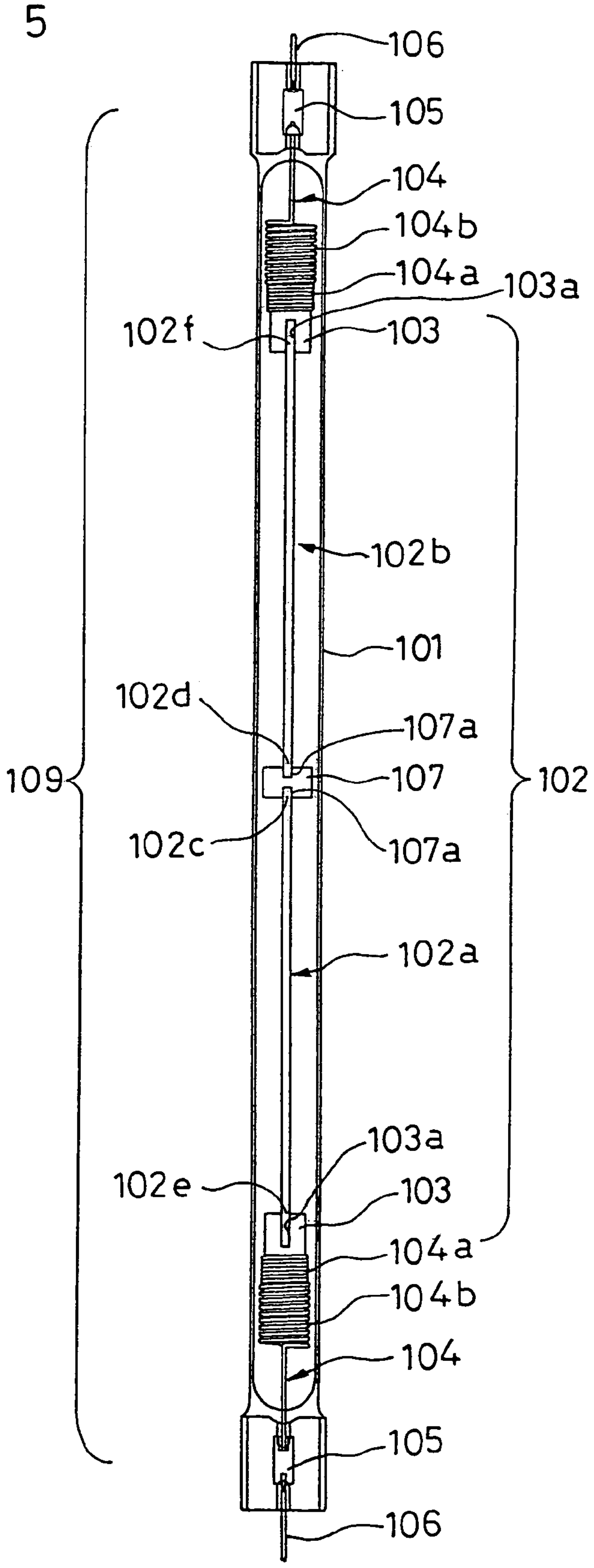
FIG. 5 is a sectional view showing an infrared lamp in a fifth embodiment of the present invention.

FIG. 5 shows the structure of an infrared lamp having a plurality of heating elements in a fifth embodiment of the present invention. FIG. 5 is a sectional view showing an infrared lamp having one heating element 102 of which at least two heating elements 102*a* and 102*b* are connected.

Referring to FIG. 5, the ends 102*c* and 102*d* of the two plate-shaped heating elements 102*a* and 102*b* are tightly fitted into the recess portions 107*a*, 107*a* of a cylindrical connection terminal 107 formed of a conductive carbon-based substance so as to electrically connect. The other ends 102*e* and 102*f* of the heating elements 102*a* and 102*b* are also tightly fitted into the recess portions 103*a* of cylindrical electrode terminals 103, 103 each formed of a carbon-based substance. The method of the connection of the heating elements 102*a* and 102*b* to the recess portions 107*a* of the connection terminal 107 and the recess portions 103*a* of the electrode terminals 103 is substantially the same as the method of the connection shown in FIG. 3. A coil-shaped portion 104*a* provided at each end of internal lead wires 104 is tightly wound around the electrode terminal 103. A coil spring portion 104*b* is formed following the coil-shaped portion 104*a* of the internal lead wire 104 preferably made of a tungsten wire. The straight portion of the internal lead wire 104, following the coil spring portion 104*b*, is welded to one end of an intermediate terminal plate 105 formed of a molybdenum foil. An external lead wire 106 formed of a molybdenum wire is welded to the other end of the intermediate terminal plate 105. In this way, a heating element assembly 109 is formed.

This heating element assembly 109 is inserted into a quartz glass tube 101, and the quartz glass tube 101 is filled with argon gas of an inert gas. The quartz glass tube 101 is then melted and sealed at both ends. A heat-resistant transparent glass tube may be used instead of the quartz glass tube 101.

The plate-shaped heating elements 102*a* and 102*b* enclosed in the quartz glass tube 101 are made of a carbon-based substance containing a mixture of crystallized carbon (for example, graphite), resistance adjustment substance and amorphous carbon. First, 45 parts by weight of a chlorinated vinyl chloride resin is mixed with 15 parts by weight of a furan resin, thereby producing a mixture A. Next, 10 parts by weight of natural graphite fine powder (having an average granularity of 5 μm) is mixed with 60 parts by weight of the above-mentioned mixture A, thereby producing a mixture B. Thirty parts by weight of boron nitride (having an average granularity of 2 μm), 70 parts by weight of the above-mentioned mixture composition B and 20 parts by weight of diallyl phthalate monomer (plasticizer) are dispersed and mixed, thereby producing a mixture C. The mixture C is formed into a wire-shaped material by an extruder. This wire-shaped material is fired for 30 minutes in a firing furnace at 1000° C. in a nitrogen atmosphere and reheated in a vacuum firing furnace at 1600° C., thereby obtaining carbon-based heating elements for this embodiment. The heating elements 102*a* and 102*b* measure 6 mm in width, 0.3 mm in thickness and 500 mm in length, for example.

Instead of the above-mentioned plate shape having a rectangular cross-section, a rod shape or a pillar shape having a polygonal cross-section may also be used for the heating element. The connection terminal 107 and the electrode terminals 103 have to be made of a heat-resistant conductive material. For example, metallic materials, such as tungsten and molybdenum, may also be used. The connection terminal 107 prevents the heating elements 102*a* and 102*b* from deflecting, relieves external vibration applied to the heating elements 102*a* and 102*b*, and functions to hold the heating elements 102*a* and 102*b* so that the heating elements 102*a* and 102*b* do not make contact with the quartz glass tube 101. The outside diameter of the connection terminal 107 is made slightly smaller (preferably about 10% smaller) than the inside diameter of the quartz glass tube 101 so that the connection terminal 107 can be inserted easily into the quartz glass tube 101.

Figure 6:
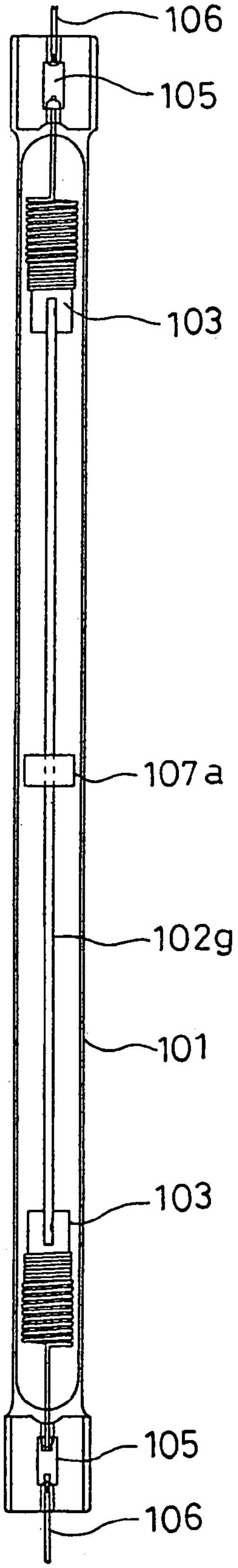
FIG. 6 is a sectional view showing another infrared lamp in the fifth embodiment of the present invention.

FIG. 6 is a sectional view of an example of an infrared lamp in which one long heating element 102*g* is used instead of two heating elements 102*a* and 102*b*. In this example, a terminal 107*a* is provided at the central portion of the heating element 102*g*. The outside diameter of the terminal 107*a* is made slightly smaller (preferably about 10% smaller) that the inside diameter of the quartz glass tube 101 so that the heating element 102*g* does not make contact with the quartz glass tube 101. A hole through which the heating element 102*g* passes is formed at the central portion of the terminal 107*a*.

In the heating element shown in FIG. 5, when the heating values of the heating elements 102*a* and 102*b* are small, the electrode terminals 103, 103 are not needed at the ends 102*e* and 102*f* of the heating elements 102*a* and 102*b* connected to each other by using the connection terminal 107. When the electrode terminals 103 are not used, the ends 102*e* and 102*f* of the heating elements 102*a* and 102*b* are directly inserted into the coil-shaped portions 104*a* and 104*b* of the internal lead wires 104, respectively. The coil spring portions 104*b* having elasticity and disposed at the coil-shaped portions 104*a* of the internal lead wires 104 are provided so as to absorb the dimensional changes of the heating elements 102*a* and 102*b* due to the expansion thereof.

The inert gas sealed inside the quartz glass tube 101 is to prevent oxidation of the components enclosed therein, and a nitrogen gas is used for example.

In the infrared lamp of this embodiment, a heating element having a desired length is obtained by connecting the two heating elements 102*a* and 102*b*. The longer the length of the heating element, the lower the production yield of the heating element. In this embodiment, a heating element having a desired length is obtained by connecting a plurality of short heating elements having high production yields. Consequently, the production yield of the heating element is improved, and the production cost is reduced. The length of the short heating elements can be set to a dimension in which the heating elements can be produced easily at the highest yield. To obtain one heating element having the desired length, more than two heating elements may be connected. By connecting a plurality of the heating elements 102*a* via plural connection terminals 107, the heating elements are held inside the quartz glass tube 101 by the plural connection terminals 107. External factors, such as vibration, applied to the heating elements are relieved, and the heating elements are prevented from making contact with the quartz glass tube 101.

[Sixth Embodiment]

Figure 7A:
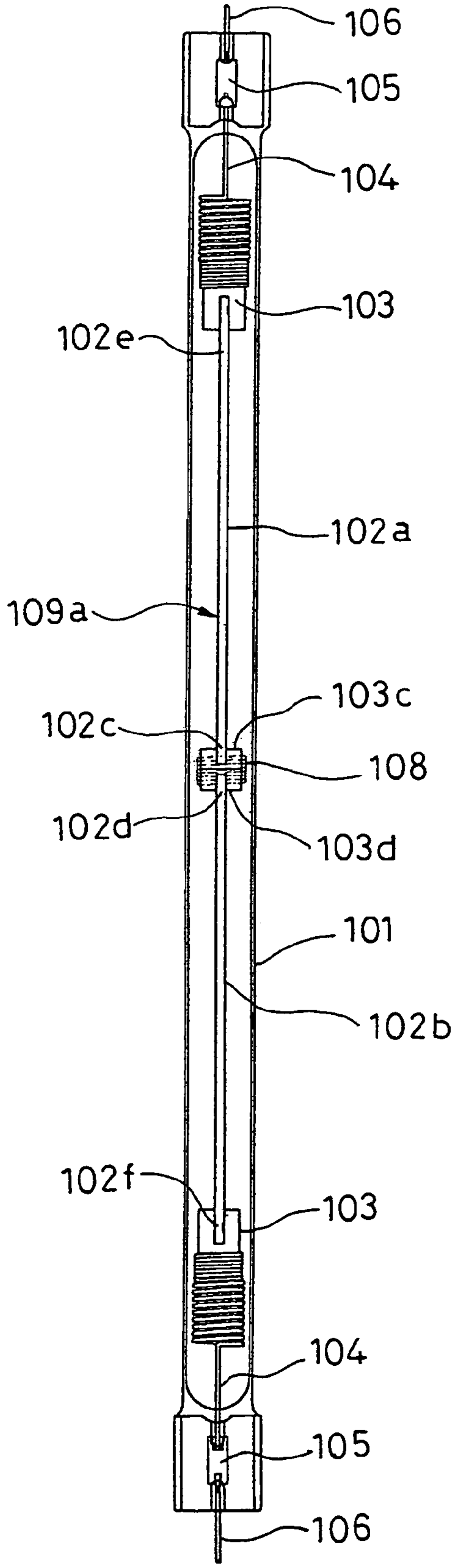
FIG. 7A is a sectional view showing an infrared lamp in a sixth embodiment of the present invention.
Figure 7B:
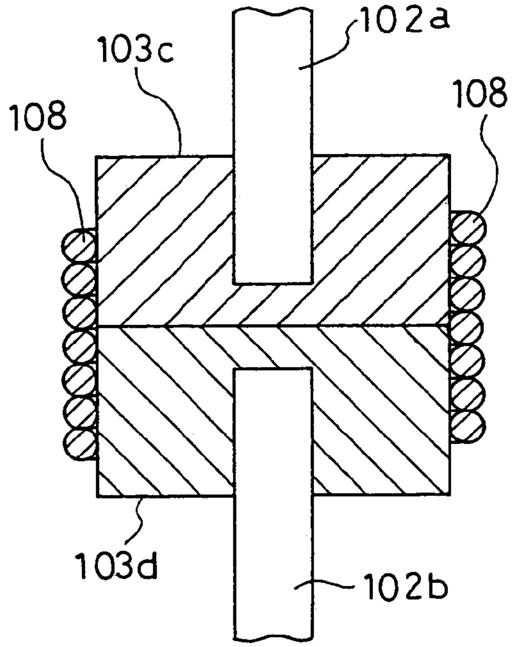
FIG. 7B is an enlarged sectional view of a central portion of the heating element.

FIG. 7A is a sectional view of an infrared lamp in a sixth embodiment of the present invention. FIG. 7B is an enlarged sectional view of a central portion of the heating element assembly 109*a* in FIG. 7A. Referring to FIG. 7A, the same components as those shown in FIG. 5 are designated by the same numerals, and their overlapping explanations are omitted. In the infrared lamp in this embodiment, the two heating elements 102*a* and 102*b* are connected via a connection member 108. One end 102*e* of the heating element 102*a* is inserted into the recess portion of an electrode terminal 103 and connected thereto so as to be conductive electrically. The other end 102*c* of the heating element 102*a* is inserted into the recess portion of an intermediate electrode 103*c* and connected thereto so as to be conductive electrically. In a similar manner, the end 102*f* of the heating element 102*b* is connected to an electrode terminal 103, and the end 102*d* of the heating element 102*b* is connected to an intermediate electrode 103*d*. The intermediate electrode 103*c* and the intermediate electrode 103*d* are inserted into the connection member 108 having the shape of a coil formed of a tungsten wire, thereby connected to each other. Consequently, the intermediate electrodes 103*c* and 103*d* are electrically connected to each other. The outside diameter of the connection member 108 is made smaller about 5 to 10%, for example, than the inside diameter of the quartz glass tube 101 into which the heating elements 102*a* and 102*b* are inserted. The electrode terminals 103 and 103 are connected to the internal lead wires 104, respectively, in a manner similar to those of the heating element assembly 109 shown in FIG. 5. The internal lead wires 104 are connected to the external lead wires 106, respectively, via the intermediate terminal plates 105. A heating element assembly 109*a* configured as described above is inserted into the quartz glass tube 101. The quartz glass tube 101 is filled with an inert gas, and both ends of the quartz glass tube 101 are sealed, thereby obtaining an infrared lamp.

The coil-shaped portion of the connection member 108 is tightly wound around the intermediate electrodes 103*c* and 103*d* so as to electrically connect the heating elements 102*a* and 102*b*. The connection member 108 may be formed of a wire made of molybdenum, nickel or stainless steel, or a wire including a carbon-based substance, instead of a wire made of tungsten. Furthermore, the connection member 108 may be also made by forming a plate made of the above-mentioned material into the shape of a coil, cylinder or screw. The intermediate electrodes 103*c* and 103*d* are formed of a conductive material, such as a carbon-based substance.

As mentioned above, a long heating element can be formed by connecting two or more short heating elements 102*a* and 102*b* via the connection member 108. The connection member 108 relieves external factors, such as vibration, applied to the infrared lamp, and holds the heating elements 102*a* and 102*b* so that they do not make contact with the inner wall of the quartz glass tube 101.

In the infrared lamp of this embodiment, a long heating element can be formed by connecting a plurality of short heating elements. Since the heating elements 102*a* and 102*b* are connected with the respective intermediate electrodes 103*c* and 103*d* and the connection member 108, in the manufacturing process, the heating elements 102*a* and 102*b* can be inserted into the quartz glass tube 101 while they are connected one by one. Therefore, the heating elements can be handled easily and combined easily. This simplifies the production process control for the infrared lamp.

[Seventh Embodiment]

Figure 8A:
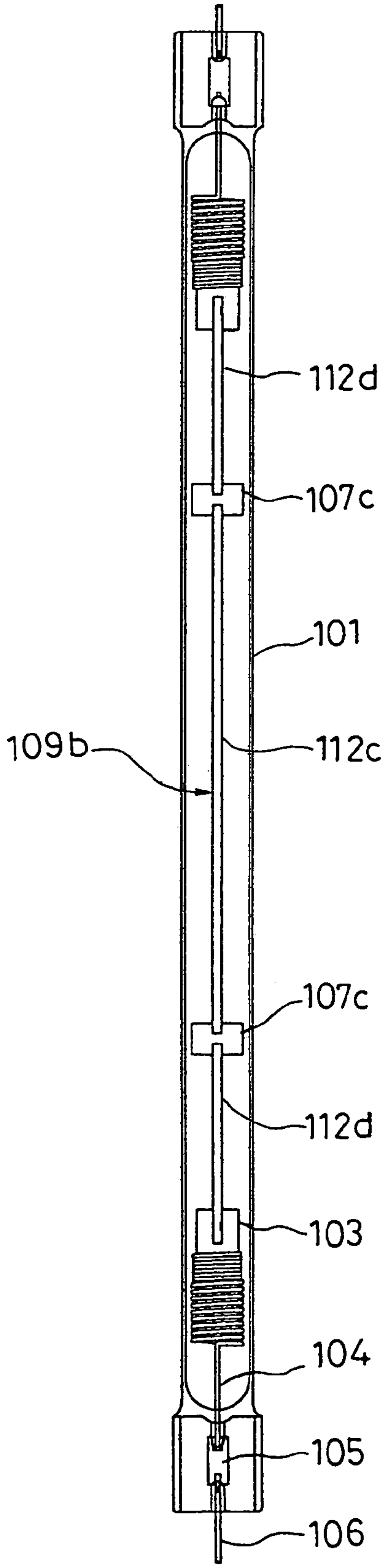
FIG. 8A is a sectional view showing an infrared lamp in a seventh embodiment of the present invention.
Figure 8B:
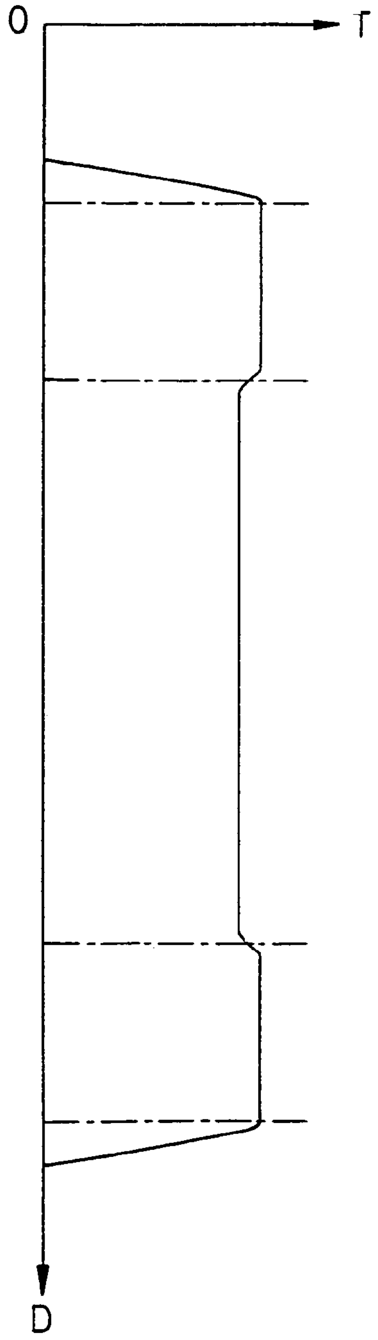
FIG. 8B is a graph showing a thermal distribution in the longitudinal direction of the infrared lamp in the seventh embodiment.

FIG. 8A is a sectional view showing an infrared lamp in a seventh embodiment of the present invention. FIG. 8B is a graph showing a thermal distribution (light distribution) represented by a temperature T with respect to a longitudinal distance D of the infrared lamp shown in FIG. 8A. In the infrared lamp of the seventh embodiment, two kinds of plate-shaped heating elements 112*c* and 112*d* which are different from each other in cross-sectional area and length are connected via two connection terminals 107*c*, 107*c* to obtain a long heating element. The same components as those shown in FIG. 5 are designated by the same numerals, and their overlapping explanations are omitted.

In FIG. 8A, two plate-shaped heating elements 112*d* and one plate-shaped heating element 112*c* are electrically connected via the two connection terminals 107*c*, thereby forming a long heating element assembly 109*b*.

The plate-shaped heating elements 112*c* and 112*d* are made of a carbon-based substance formed of a mixture of crystallized carbon (for example graphite), resistance adjustment substance and amorphous carbon. The carbon-based substance is made as described below, for example. First, 45 parts by weight of a chlorinated vinyl chloride resin is mixed with 15 parts by weight of a furan resin, thereby producing a mixture A. Next, 10 parts by weight of natural graphite fine powder (having an average granularity of 5 μm) is mixed with 60 parts by weight of the above-mentioned mixture A, thereby producing a mixture B. Thirty parts by weight of boron nitride (having an average granularity of 2 μm), 70 parts by weight of the above-mentioned mixture composition B and 20 parts by weight of diallyl phthalate monomer (plasticizer) are dispersed and mixed, thereby producing a mixture C. The mixture C is formed by an extruder to have a wire-shaped material. This wire-shaped material is fired for 30 minutes in a firing furnace at 1000° C. in a nitrogen atmosphere and reheated in a vacuum firing furnace at 1600° C., thereby obtaining carbon-based heating elements for this embodiment. The inherent resistance of the plate-shaped heating element 112*c* is the same as that of the plate-shaped heating element 112*d*. The heating element 112*d* measures 6 mm in width, 0.30 mm in thickness and 200 mm in length, and the heating element 112*c* measures 6 mm in width, 0.33 mm in thickness and 600 mm in length.

Since the thickness of the heating element 102*c* is larger than that of the heating element 102*d*, the cross-sectional area of the heating element 102*c* is larger than that of the heating element 102*d*. Therefore, the resistance per unit length of the heating element 102*c* disposed at the central portion is lower than those of the heating elements 102*d* disposed on both sides and the temperature at the central portion can be made lower than those on both sides.

In the distribution (light distribution) of temperature T in the longitudinal direction D of the infrared lamp of this embodiment, as shown in FIG. 8B, the temperature T becomes high on both sides and becomes low at the central portion.

In FIG. 8A, the heating elements 102*c* and 102*d* are connected via the connection terminals 107*c*. However, in a manner similar to FIG. 7A, the intermediate electrodes 103*d* and 103*c* attached to the ends of the heating elements 112*c* and 112*d* are capable of connecting the heating elements 112*c* and 112*b* with the connection member 108, and a long heating element similar to that shown in FIG. 8A can also be formed.

By combining a plurality of heating elements as mentioned above, it is possible to form a heating element having a desired length and a desired thermal distribution.

[Eighth Embodiment]

Figure 9A:
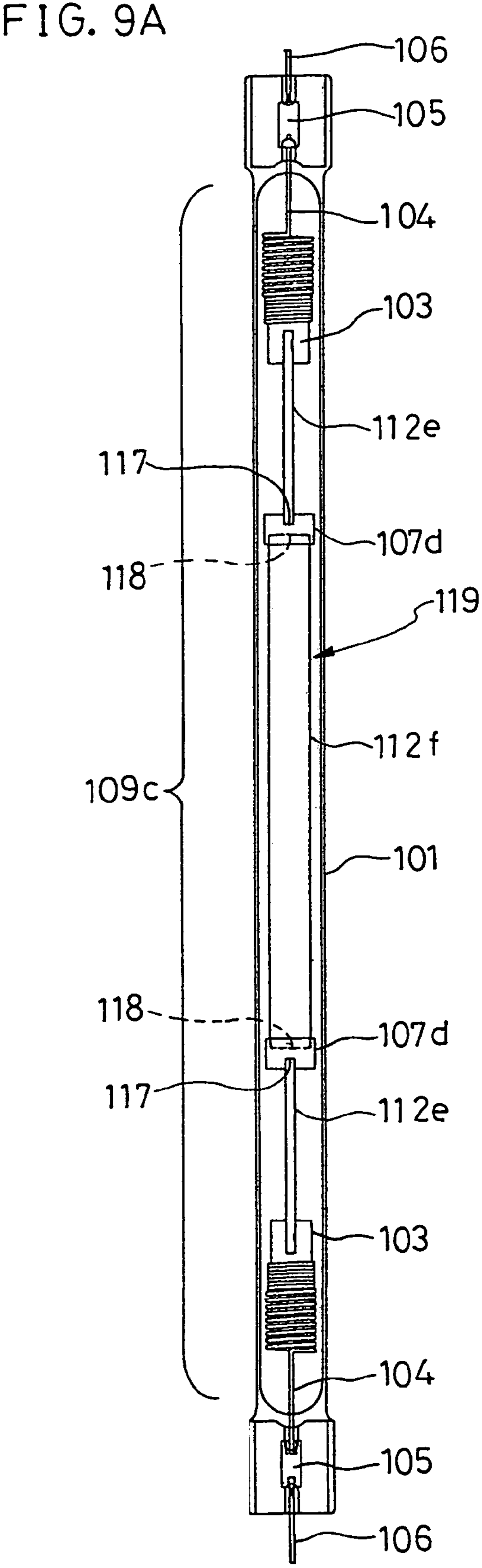
FIG. 9A is a sectional view showing an infrared lamp in an eighth embodiment of the present invention.
Figure 9B:
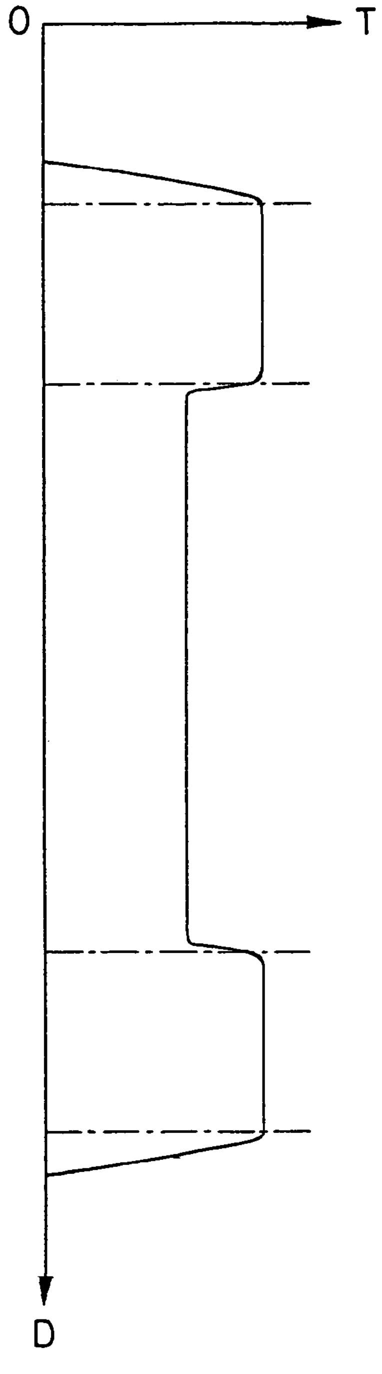
FIG. 9B is a graph showing a thermal distribution in the longitudinal direction of the infrared lamp in the eighth embodiment.
Figure 10:
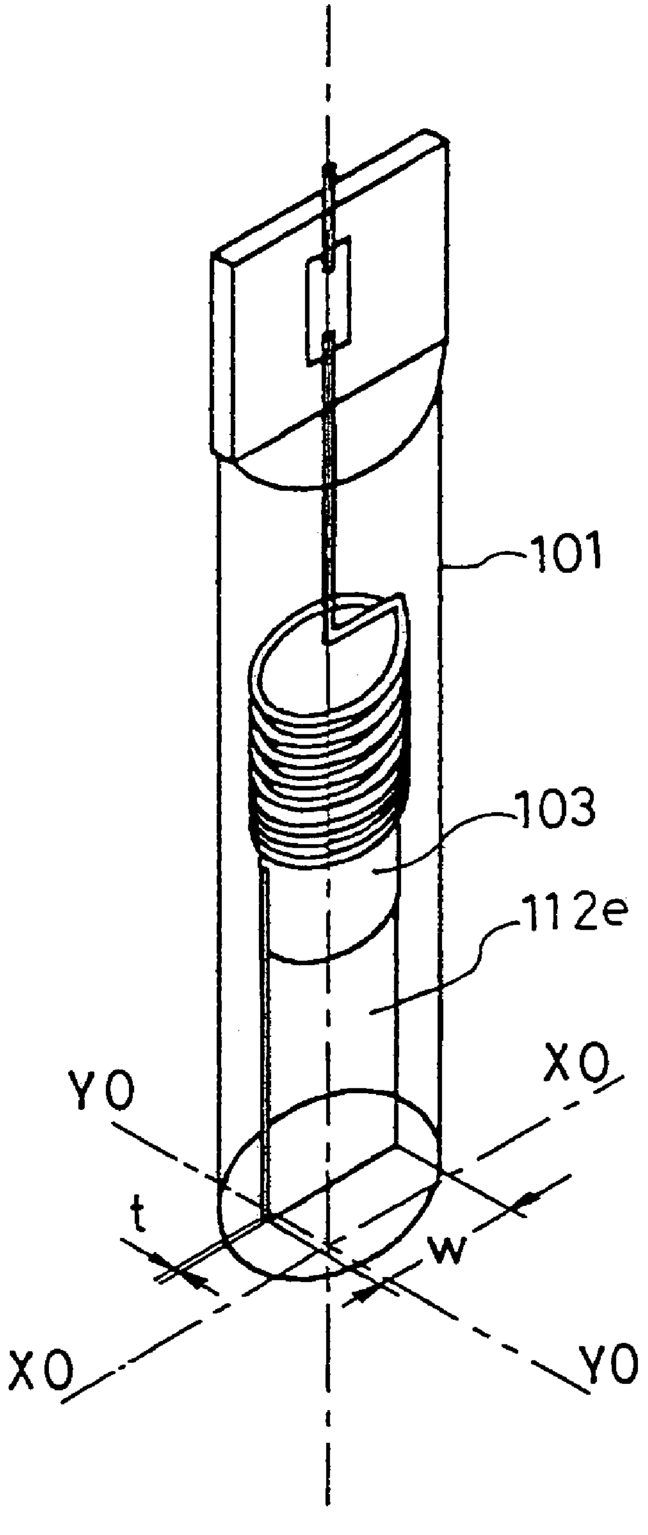
FIG. 10 is a perspective view showing a structure at an end of the infrared lamp in the eighth embodiment of the present invention.

FIG. 9A is a sectional view showing an infrared lamp in an eighth embodiment of the present invention. FIG. 9B is a graph showing the thermal distribution (light distribution)

represented by a temperature T with respect to a longitudinal distance D of the infrared lamp of the eighth embodiment shown in FIG. 9A. FIG. 10 is a perspective view showing an end of the infrared lamp shown in FIG. 9A. FIG. 11 is a graph showing a thermal distribution in a direction perpendicular to the longitudinal direction of a heating element 112*e* shown in FIG. 10.

The heating element of the infrared lamp in the eighth embodiment is a long heating element which is formed by connecting two plate-shaped heating elements 112*e* to one plate-shaped heating element 112*f*. The length of the heating element 112*f* is different from those of the heating elements 112*e*. The orientations of the wide faces of the heating elements 112*e* are displaced by 90° with respect to that of the heating element 112*f*. The same components as those shown in FIG. 8A are designated by the same numerals, and their overlapping explanations are omitted.

As shown in FIG. 9A, two plate-shaped heating elements 112*e* and one plate-shaped heating element 112*f* are electrically connected via two connection terminals 107*d* each having two orthogonal recess portions 117 and 118 formed on opposite faces, respectively, thereby forming a long heating element 119. The internal lead wires 104 are attached to both ends of the long heating element 119, thereby forming the long heating element assembly 109*c*.

The plate-shaped heating elements 112*e* and 112*f* are formed of a mixture of crystallized carbon (for example graphite), resistance adjustment substance and amorphous carbon. First, 45 parts by weight of a chlorinated vinyl chloride resin is mixed with 15 parts by weight of a furan resin, thereby producing a mixture A. Next, 10 parts by weight of natural graphite fine powder (having an average granularity of 5 μm) is mixed with 60 parts by weight of the above-mentioned mixture A, thereby producing a mixture B. Thirty parts by weight of boron nitride (having an average granularity of 2 μm), 70 parts by weight of the above-mentioned mixture composition B and 20 parts, by weight of diallyl phthalate monomer (plasticizer) are dispersed and mixed, thereby producing a mixture C. The mixture C is formed by an extruder to have a wire-shaped material. This wire-shaped material is fired for 30 minutes in a firing furnace at 1000° C. in a nitrogen atmosphere and reheated in a vacuum firing furnace at 1600° C., thereby obtaining carbon-based heating elements for this embodiment. The inherent resistance of the plate-shaped heating element 112*e* is the same as that of the plate-shaped heating element 112*f*. The heating element 112*e* measures 6 mm in width, 0.3 mm in thickness and 300 mm in length, and the heating element 112*f* measures 6 mm in width, 0.3 mm in thickness and 600 mm in length.

When the ratio of the thickness t to the width w of the plate-shaped heating element 112*e* is 1:5 or more as shown in FIG. 10, it is possible to obtain a thermal distribution different in a direction perpendicular to the longitudinal direction of the heating element. Direction x and direction y in FIG. 11 correspond direction along a line XO—XO and direction along a line YO—YO in FIG. 10, respectively. In the eighth embodiment, the ratio of the width to the thickness of the plate-shaped heating element is 20. Hence, it is possible to realize an infrared lamp, the thermal distribution of which differs in the directions around the heating element.

As shown in FIG. 9A, the plate-shaped heating elements 112*e* having the above-mentioned directivity in a direction perpendicular to the axial direction of the infrared lamp are connected to the heating element 112*f* via the connection terminals 107*d* so that the wide faces of the heating elements 112*e* are perpendicular to the wide face of the heating element 112*f*. FIG. 9B is a graph showing the distribution of the temperature T in the axial direction D of the plate-shaped heating elements 112*e* and 112*f* of this infrared lamp.

FIG. 9B shows the thermal distribution (light distribution), of the axial direction of the infrared lamp in the direction parallel to the wide face of the heating element 112*f*. The temperature becomes high in the direction of the flat face of the heating element 112*e* and becomes low in the direction of the thickness thereof Hence, the directivity of the temperature distribution of a heating element assembly 109*c* can be set as desired.

Figure 11A:
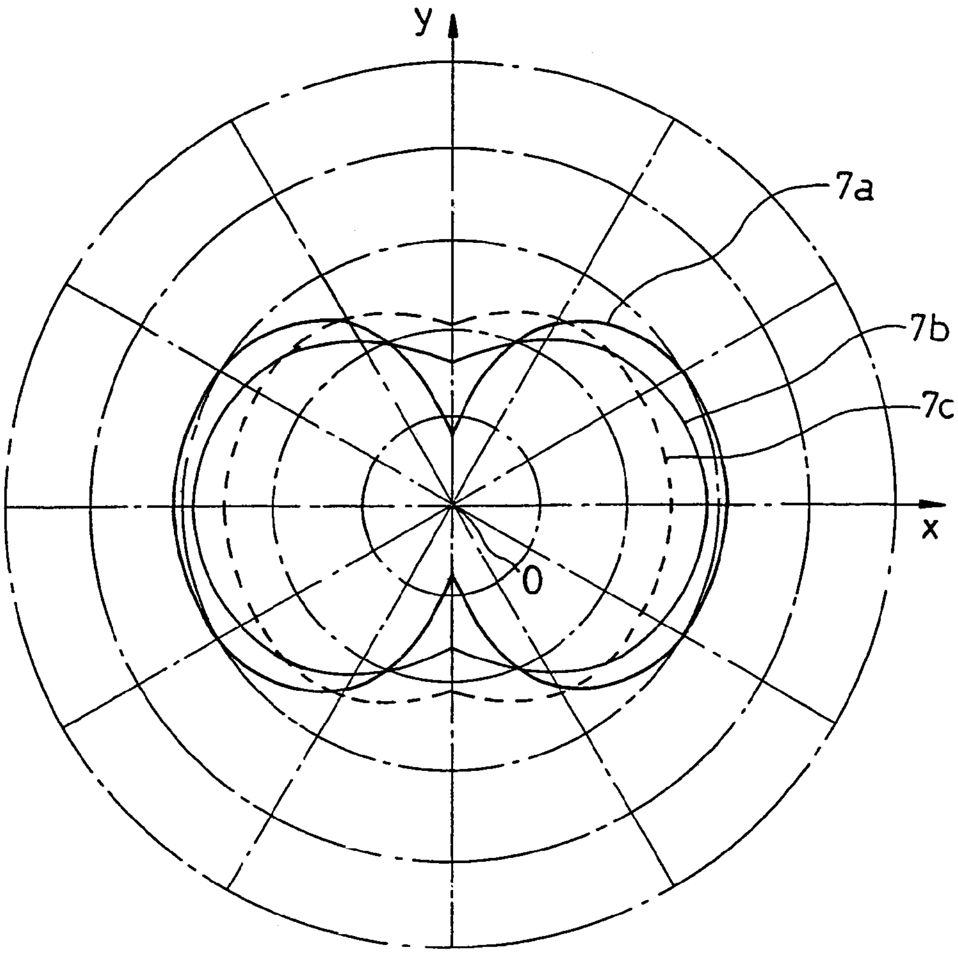
FIG. 11A is a graph showing a thermal distribution in a direction perpendicular to the longitudinal direction of the plate-shaped heating element in the eighth embodiment of the present invention.
Figure 11B:
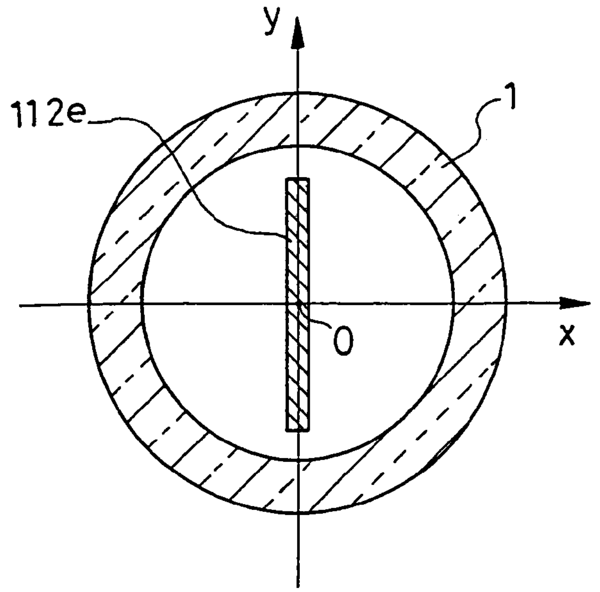
FIG. 11B is a sectional view of the infrared lamp.

FIG. 11A is a graph showing the directional distributions 7*a*, 7*b* and 7*c* of the intensity of the infrared rays radiated from the heating element 112*e*. FIG. 11B shows the cross section of the central portion of the infrared lamp of this embodiment. The x and y axes shown in FIG. 11A and FIG 11B. 11 are orthogonal coordinate axes on a plane perpendicular to the axial direction of the heating element 112*e* shown in FIG. 10. As shown in FIG. 11B, the origin O corresponds to the substantial center axis of the heating element 112*e*. Furthermore, the x axis corresponds to the thickness direction of the heating element 112*e*, and the y axis corresponds to the width direction thereof. In FIG. 11A, the values in the radial directions designate the radiation intensity of the infrared rays, and the angular directions designate angular directions from the x axis on the plane perpendicular to the longitudinal direction of the heating element 112*e*. In addition, the thick solid line 7*a*, the thin solid line 7*b* and the broken line 7*c* in FIG. 11A designate the directional distributions in the case when the width T of the heating element 112*e* is 6.0 mm, 2.5 mm and 1.0 mm, that is, T=12 t, 5 t and 2 t, respectively.

The directional distributions 7*a*, 7*b* and 7*c* were measured as described below. First, a constant power 600 W is applied to an infrared lamp. In a condition wherein infrared rays are radiated stably from the infrared lamp, the amount of infrared rays reaching a predetermined minute area at a position located a constant distance (about 300 mm) away from the center line (the origin O of FIG. 11) of the heating element 112*e* is measured. This measurement is repeated while the direction with respect to the heating element 112*e* is changed, with the distance from the origin O being maintained constant. As the result of this measurement, the directional distributions 7*a*, 7*b* and 7*c* shown were obtained.

As indicated by the directional distributions 7*a*, 7*b* and 7*c*, the directivity of the intensity of the infrared rays radiated from the heating element 112*e* is higher as the ratio of the width T to the thickness t of the heating element 112*e* is higher. In particular, when T≧5 t that is, when the ratio of the width T to the thickness t is five or more, the radiation intensity in the y-axis direction is significantly lower than that in the x-axis direction.

In the case when the infrared rays are radiated unequally with respect to direction as described above, for example, when only a predetermined region is desired to be heated, the region should be placed on the x axis. On the other hand, when only the predetermined region is not desired to be heated, the region should be placed on the y axis. As a result, the radiation intensity can have directivity, even if such a reflector as that used for the conventional example is not provided.

The above description is made as to an example of which the plate-shaped heating elements 112*e* and 112*f* are connected via the connection terminals 107*d*, 107*d*. As shown in FIG. 7 in the sixth embodiment, the heating element 112*e*, 112*f* can be coupled by two upper and lower intermediate electrodes 103*c* and 103*d* connected via the connection member 108. As a result, a configuration similar to the example can be obtained. Since the connection member 108 has the shape of a coil in this case, the directions of the plate-shaped heating elements 112*e* and 112*f* can be set as desired.

In accordance with the infrared lamp of this embodiment, it is possible to realize an infrared lamp having a long heating element wherein a desired thermal distribution is set by combining a plurality of plate-shaped heating elements while changing the directions of their faces.

[Ninth Embodiment]

Figure 12A:
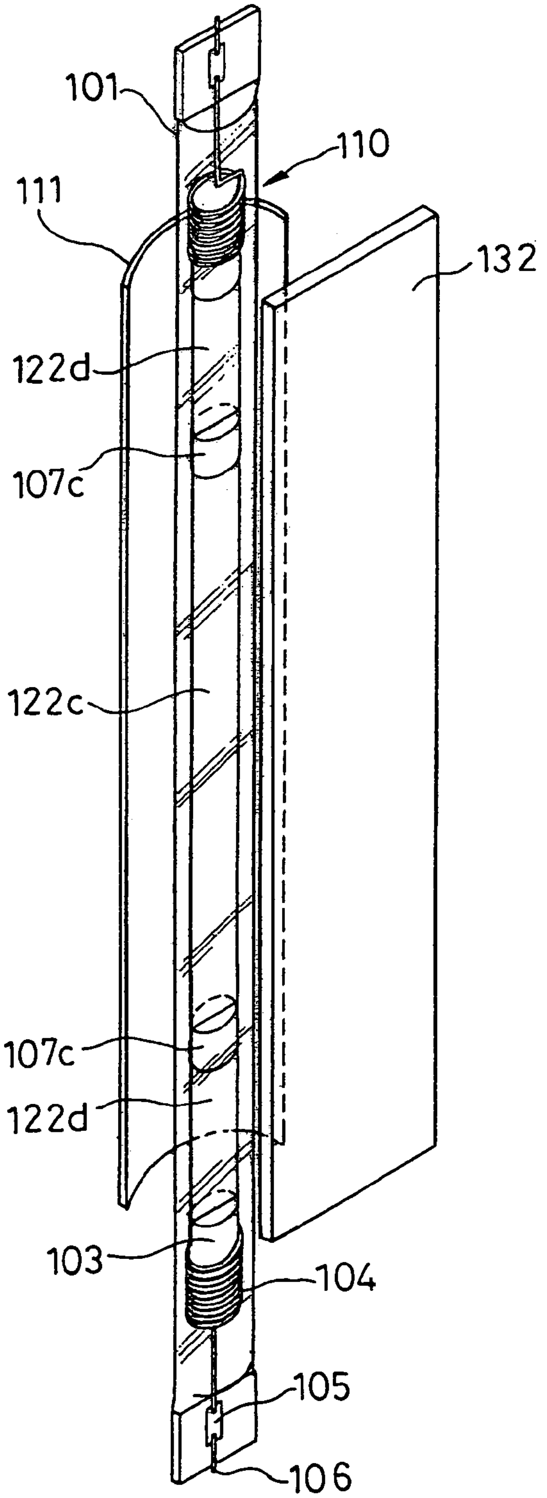
FIG. 12A is a perspective view showing the main portion of a heating apparatus including the infrared lamp of the ninth embodiment.
Figure 12B:
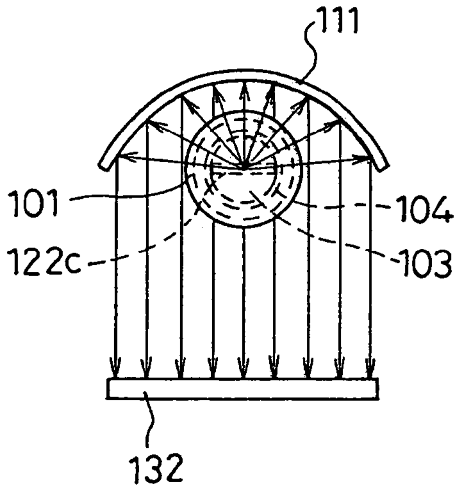
FIG. 12B is a sectional view showing the heating apparatus.
Figure 13:
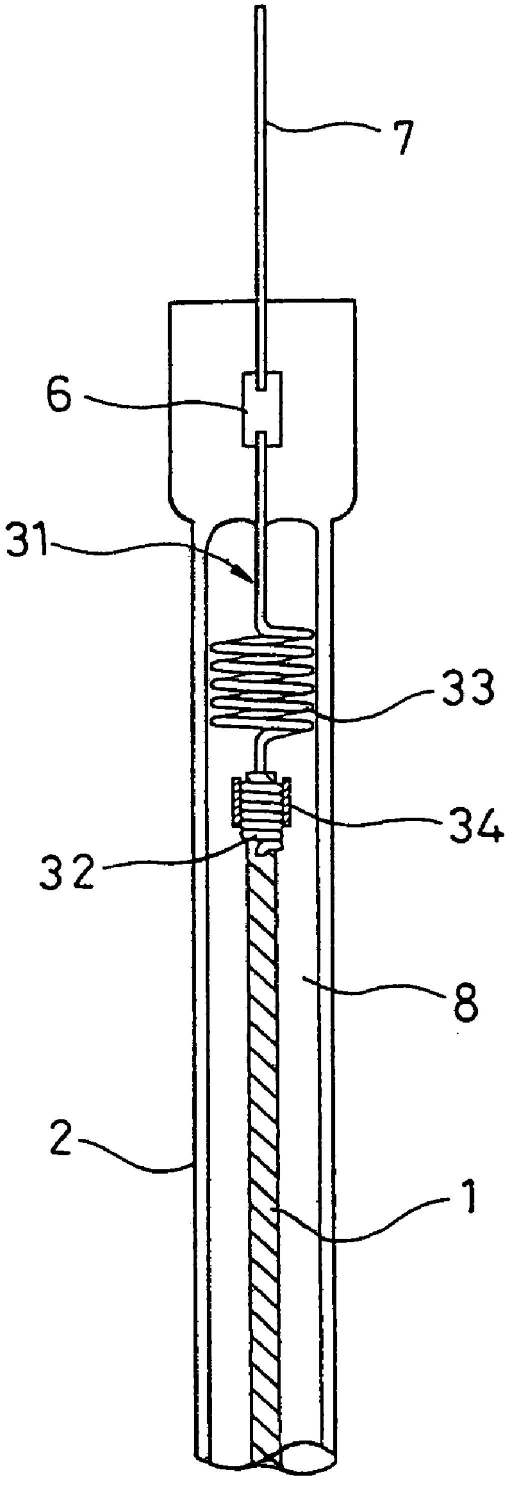
FIG. 13 (Prior Art)
FIG. 13 is the fragmentary sectional view showing the conventional infrared lamp.
Figure 14:
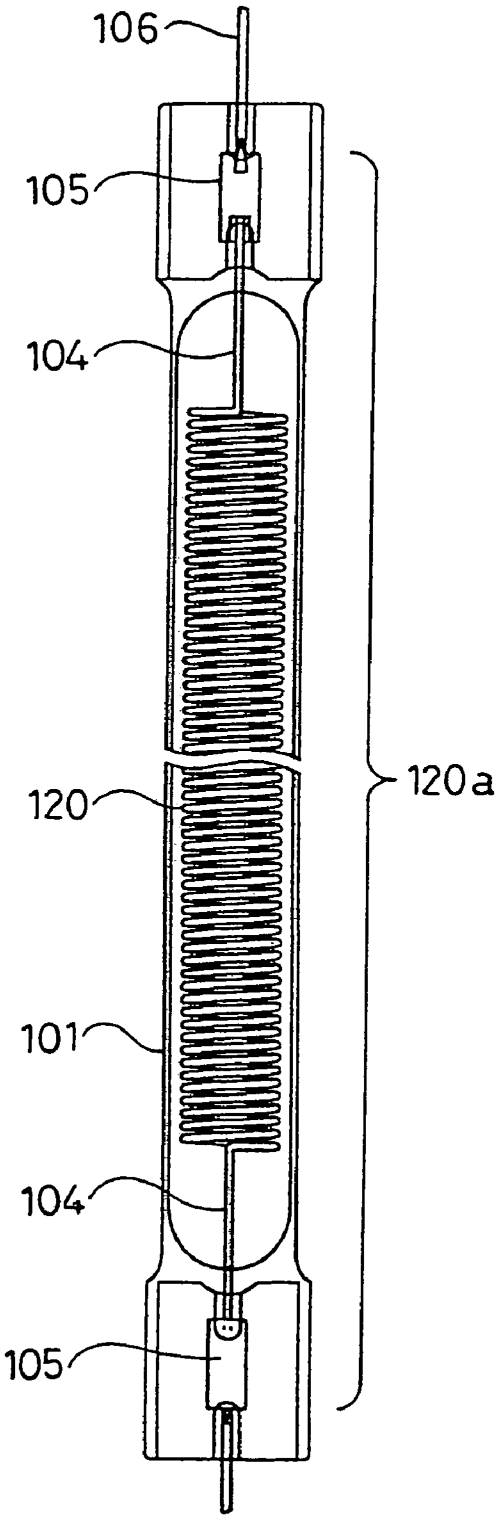
FIG. 14 (Prior Art)
FIG. 14 is the sectional view showing the structure of the conventional infrared lamp.

FIG. 12A is a perspective view showing a configuration of a heating section of a heating apparatus in a ninth embodiment of the present invention using the infrared lamp of the seventh embodiment. FIG. 12B is a sectional view of the heating section showing a heat radiation state. The same components as those of the seventh embodiment are designated by the same numerals in the following description.

Referring to FIG. 12A, in the heating apparatus of this embodiment, the plate-shaped heating elements 122*c* and 122*d* of an infrared lamp 110 are arranged so that their faces are directed to an object 132 to be heated. Furthermore, a reflector 111 made of aluminum is disposed at the back of the plate-shaped heating elements 122*c* and 122*d* so as to be opposed to the object 132 to be heated.

The shape of the reflection face of the reflector 111 is a parabola having a focus at the position of the heating elements 122*c* and 122*d* so that light is converged to the object 132 to be heated.

By placing the plate-shaped heating element 122*c* and 122*d* of the infrared lamp 110 so that its face is directed to the object 132 to be heated as shown in FIG. 12B, heat radiation has directivity, whereby the object 132 to be heated can be heated more effectively. In addition, since heat radiation is also significant at the back of the plate-shaped heating elements 122*c* in a direction opposed to the object 132 to be heated, the reflector 111 having a parabolic face serving to reflect the heat to the object 132 to be heated is provided at the back of the plate-shaped heating element 122*c*. As a result, the heat radiated from the infrared lamp is applied efficiently to the object 132 to be heated.

By arranging the reflector 111 and the object 132 to be heated in the axial direction of the infrared lamp 110 having a long heating element as described above, it is possible to realize a heating apparatus having the thermal distribution and thermal directivity shown in FIG. 12B.

In this heating apparatus, since the object 132 to be heated is disposed in parallel with the longitudinal direction of the long heating element, a long object can be heated efficiently. For example, this heating apparatus can be effectively used as an industrial heating apparatus, such as a conveyor type heating apparatus by aligning the longitudinal direction of the heating element with the traveling direction of the conveyor.

The shape of the reflection face of the reflector 111 is a parabola having a focus at the portion of the heating elements so that light is reflected to the face of the object to be heated. However, the shape may be a plane, curve or cylinder, for example. The material of the reflector 111 should only be a material that can efficiently reflect the radiation light from the infrared lamp 110. It may be possible to use a stainless steel plate, plated steel plate, etc., for example.

Furthermore, when the heat from the heating element is used so as to be absorbed, a heat-absorbing plate coated with a far-infrared ray absorbing paint (black) may be disposed in contact or non-contact with the face of the object 132 to be heated.

Apparatuses using the infrared lamp of the present invention will be described below.

The infrared lamp of the present invention, highly effective in heating organic substances as described in the explanations of the above-mentioned embodiments, can have suitable results for energy-saving apparatuses, various food processing apparatuses having a cooking effect similar to that obtained by using a charcoal fire, industrial apparatuses, etc., when applied to various apparatuses described below.

1) Warming apparatuses: heaters, saunas, kotatsu, foot warmers, drying/warming apparatuses for bathrooms and changing rooms, etc.

2) Drying apparatuses: clothing driers, dish driers, bedding driers, paint film drying and baking apparatuses, printed matter drying apparatuses, washed PC board drying apparatuses, water-washed photographic paper drying apparatuses, etc.

3) Heating apparatuses: drinking water heating apparatuses, aquarium heating apparatuses, defrosters in refrigerators, water heaters, garbage processing apparatuses, various food heaters, toner fusing heaters of LBP, PPC, PPF and FAX, etc.

4) Warmth-maintaining apparatuses: delivery carts and warmth-maintaining apparatuses for meat buns, sausages, yakitori, takoyaki, etc.

5) Cooking apparatuses: microwave ovens, roasters, toasters, oven ranges, yakitori cookers, hamburger cookers, various home-use and industrial cooking apparatuses, etc.

6) Medical apparatuses: infrared treatment apparatuses, etc.

7) Decocting apparatuses: decocting apparatuses for sesame, parched small sardines, coffee, barley tea, peanuts, bean cakes, almonds, etc.

8) Aging apparatuses: aging apparatuses for fruit wine, pickles, ham, smoked foods, sausages, cheese, etc.

9) Fermenting apparatuses: fermenting apparatuses for yogurt, vinegar, soy sauce, lactic acid drink, wu long tea, fermented liquor, etc.

10) Thawing apparatuses: thawing apparatuses for frozen foods

11) Firing apparatuses: firing apparatuses for kamaboko fish paste, chikuwa fish paste, bread, cakes, baked sweet potatoes, sweet roast chestnuts, parched seaweed, fish meat, etc.

12) Sterilizing apparatuses: sterilizing apparatuses for buckwheat, dried bonito, fruits, vacuum packed foods, etc.

The apparatus of the present invention can be used for these apparatuses.

As described above in detail regarding the embodiments, the infrared lamp and the heating apparatus using the infrared lamp in accordance with the present invention have the following effects.

In the infrared lamp of the present invention, by connecting a plurality of short heating elements to one another via connection terminals or connectors, a long heating element can be formed easily at low cost while preventing the heating element from hanging down. In addition, the long heating element configured as described above is inserted into a quartz glass tube, and the quartz glass tube is filled with an inert gas. This configuration prevents the heating element from being damaged by external impact, and it is possible to realize an infrared lamp capable of being used at high temperatures.

Furthermore, a desired thermal distribution (light distribution) is attained in the longitudinal direction of a long heating element obtained by the connection by combining a plurality of heating elements having different heating values. In particular, it is possible to provide a desired thermal distribution in the axial direction of the infrared lamp by connecting a plurality of plate-shaped heating elements having a rectangular cross-section and having a width-thickness ratio of 5:1 or more while changing the orientations of their flat faces.

Still further, it is possible to realize a low cost heating apparatus having a desired thermal distribution and a desired thermal directivity, and featuring high efficiency and wide selective applicability depending on a heating method, and further having excellent usability by using the infrared lamp in accordance with the present invention.

As detailed in the explanations of the embodiments, the infrared lamp of the present invention uses a heating element formed of a sintered body including a carbon-based substance. More carbon is contained in the surface layer than in the inside of the sintered body.

For these reasons, the emissivity of the heating element is closer to that of a black body than those of conventional heaters and lamps, such as a sheath heater, a nichrome wire heater, a quartz lamp heater, a halogen lamp heater and a conventional infrared lamp having a sintered body including a carbon-based substance. As a result, it is possible to attain an infrared lamp having high radiation intensity of infrared rays in its infrared ray radiation area.

Furthermore, the volume of the heating element is small, and the resistance-temperature characteristic of the heating element is almost flat. Hence, the temperature of the heating element reaches an equilibrium temperature in a very short time after the power is turned on, whereby the heating element is excellent in quick heating performance.

Moreover, by using the infrared lamp of the present invention, it is possible to attain apparatuses capable of shortening the processing times of various foods, that is, apparatuses being high in energy efficiency. It is thus possible to provide a taste close to that obtained by using a conventional charcoal fire. Still further, when the infrared lamp of the present invention is applied to various materials or surface conditions having absorption wavelengths close to the peak wavelength (about 2.1 μm) of the radiation light of the infrared lamp of the present invention, instead of foods, it is possible to attain energy-saving apparatuses capable of shortening the processing times of the various materials in a way similar to that described above.

What is claimed is:

1. A method of producing an infrared lamp comprising the steps of:

connecting a connection terminal to at least one end of each of a plurality of heating elements formed of a sintered body including a carbon-based substance, forming one long heating element by connecting said heating element having said connected connection terminal to other heating elements via connection terminals, connecting a pair of electrode terminals to both ends of said long heating element, electrically connecting one end of an internal lead wire, the other end of which is connected to one end of an intermediate terminal plate, to each of said electrode terminals, forming a heating element assembly by connecting an external lead wire to the other end of said intermediate terminal plate, inserting said heating element assembly into a heat-resistant transparent glass tube, filling said heat-resistant transparent glass tube with an inert gas, melting both ends of said heat-resistant transparent glass tube, and sealing said heat-resistant transparent glass tube at said intermediate terminal plates of said heating element assembly.

2. A method of producing an infrared lamp comprising the steps of:

connecting electrode terminals to both ends of each of a plurality of heating elements formed of a sintered body including a carbon-based substance, forming one long heating element by connecting said electrode terminals of said heating elements connected by said electrode terminals via connection terminals, electrically connecting one end of an internal lead wire, the other end of which is connected to one end of an intermediate terminal plate, to said electrode terminal of each of both ends of said long heating a element, forming a heating element assembly by connecting one end of an external lead wire to the other end of said intermediate terminal plate, inserting said heating element assembly into said heat-resistant transparent glass tube, filling said heat-resistant transparent glass tube with an inert gas, melting both ends of said heat-resistant transparent glass, and sealing said heat-resistant transparent glass tube at said intermediate terminal plates of said heating element assembly.

3. A method of producing an infrared lamp comprising:

firing a mixture of a carbon composition having compactibility and a carbon yield of substantially nonzero after firing and at least one kind of metallic or semi-metallic compound to form a carbon-based heating element, reheating said carbon-based heating element in a vacuum to set the change rate of the electric specific resistance of said carbon-based heating element at a high temperature in lit state with respect to electric specific resistance at a normal temperature in an unlit state in the range from −20% to +20%, electrically connecting lead wires to both ends of said carbon-based heating element, and accommodating said carbon-based heating element in a sealed quartz glass tube filled with a gas so that the ends of said lead wires extend outside said sealed quartz glass tube.

4. The method of claim 3, wherein the metallic or semi-metallic compound included in said carbon-based heating element is selected from the group consisting of metallic carbide, metallic boride, metallic silicide, metallic nitride, metallic oxide, semi-metallic nitride, semi-metallic oxide and semi-metallic carbide.

5. The method of claim 3, wherein said carbon-based heating element includes resins.

6. The method of claim 3, wherein said carbon-based heating element includes at least one powder selected from the group consisting of carbon black, graphite and coke powder.

7. The method of claim 3, wherein said lead wires are electrically connected to current passing portions of said carbon-based heating element via connection members having an inherent resistance smaller than that of said carbon based heating element and larger than that of said lead wires.

* * * * *